US012288591B2

(12) United States Patent
Laurent et al.

(10) Patent No.: US 12,288,591 B2
(45) Date of Patent: Apr. 29, 2025

(54) MEMORY DEVICE HAVING AN IMPROVED ECC ARCHITECTURE

(71) Applicant: Micron Technology, Inc., Boise, ID (US)

(72) Inventors: Christophe Laurent, Agrate Brianza (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/802,009

(22) PCT Filed: Mar. 2, 2021

(86) PCT No.: PCT/IB2021/020010
§ 371 (c)(1),
(2) Date: Sep. 9, 2022

(87) PCT Pub. No.: WO2022/185090
PCT Pub. Date: Sep. 9, 2022

(65) Prior Publication Data
US 2024/0221856 A1    Jul. 4, 2024

(51) Int. Cl.
*G01R 31/317* (2006.01)
*G01R 31/3177* (2006.01)
(Continued)

(52) U.S. Cl.
CPC .............. *G11C 29/42* (2013.01); *G11C 29/52* (2013.01)

(58) Field of Classification Search
CPC ................................ G11C 29/42; G11C 29/52
See application file for complete search history.

(56) References Cited

U.S. PATENT DOCUMENTS

2006/0248434 A1    11/2006  Radke et al.
2009/0070651 A1    3/2009   Diggs et al.
(Continued)

OTHER PUBLICATIONS

International Search Report and Written Opinion from related International Patent Application No. PCT/IB2021/020010, dated Nov. 18, 2021, 10 pages.

*Primary Examiner* — Guy J Lamarre
(74) *Attorney, Agent, or Firm* — Brooks, Cameron & Huebsch, PLLC

(57) ABSTRACT

The present disclosure relates to a memory device comprising an array of memory cells and an operating circuit for managing the operation of the array, the operating circuit comprising an encoding unit configured to generate a codeword, the codeword comprising payload data stored in a plurality of memory cells of the array, parity data associated with the payload data stored in parity cells of the memory array, wherein a number of parity cells to be used to store the parity data is selectable based on a status of the plurality of memory cells and is related to a selected Error Correction Code (ECC) protection level, and extra payload data stored in unused parity cells, the device further comprising a decoding unit configured to perform an ECC operation on the stored codeword based on the selected ECC protection level. The encoding unit and the decoding unit comprise respective circuit portions configured to be selectively activable based on the selected ECC protection level, and each circuit portion is configured to manage a respective predetermined payload and parity quantity of the codeword.

26 Claims, 20 Drawing Sheets

(51) Int. Cl.
    *G01R 31/3185*    (2006.01)
    *G06F 11/26*    (2006.01)
    *G06F 11/267*    (2006.01)
    *G06F 11/27*    (2006.01)
    *G06F 11/34*    (2006.01)
    *G11C 29/42*    (2006.01)
    *G11C 29/52*    (2006.01)

(56) References Cited

U.S. PATENT DOCUMENTS

| | | |
|---|---|---|
| 2014/0006898 A1 | 1/2014 | Sharon et al. |
| 2019/0250985 A1 | 8/2019 | Seo et al. |
| 2020/0059252 A1 | 2/2020 | Fackenthal |
| 2024/0103741 A1* | 3/2024 | Sforzin ................ G06F 3/0629 |

* cited by examiner

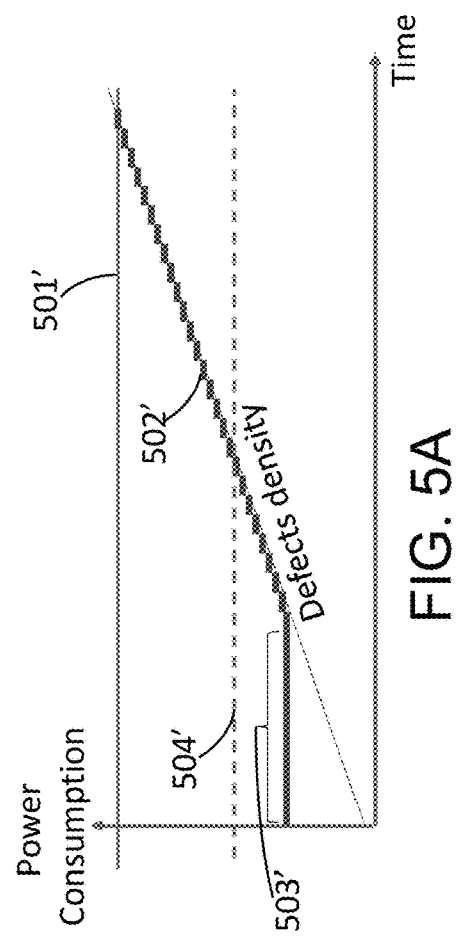
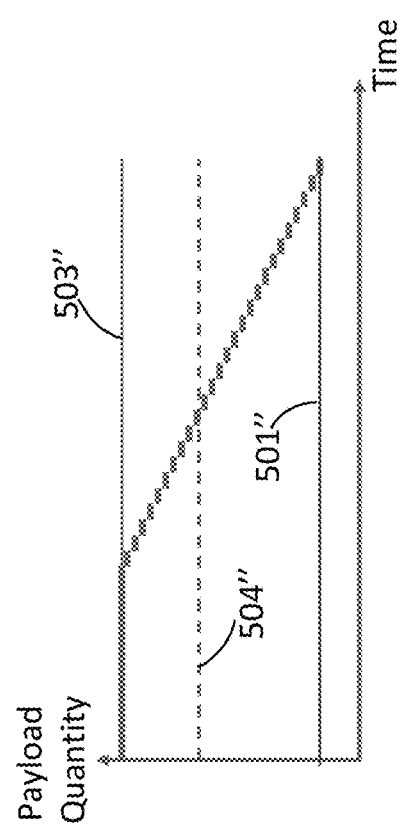
FIG. 5A
FIG. 5B

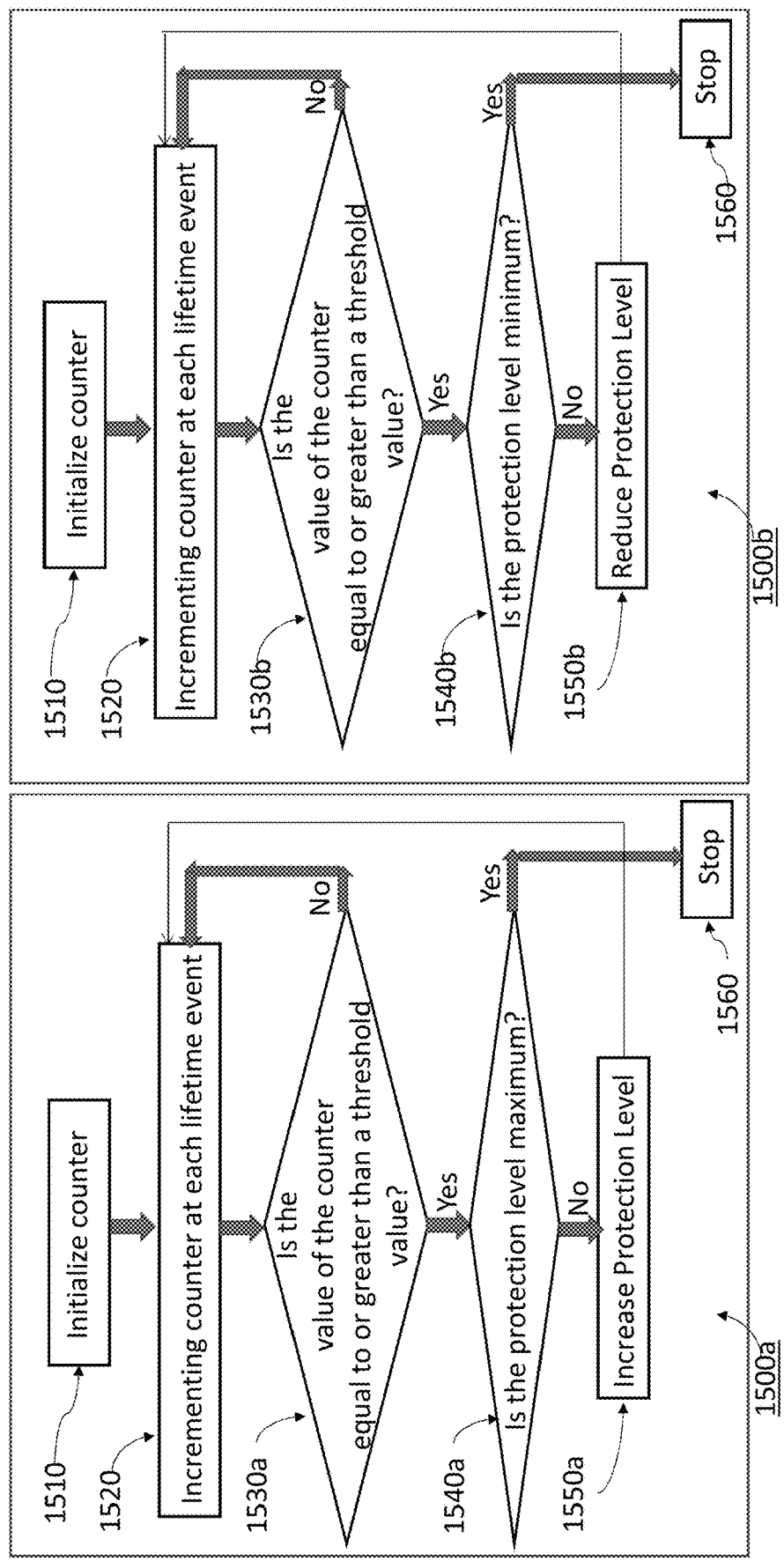

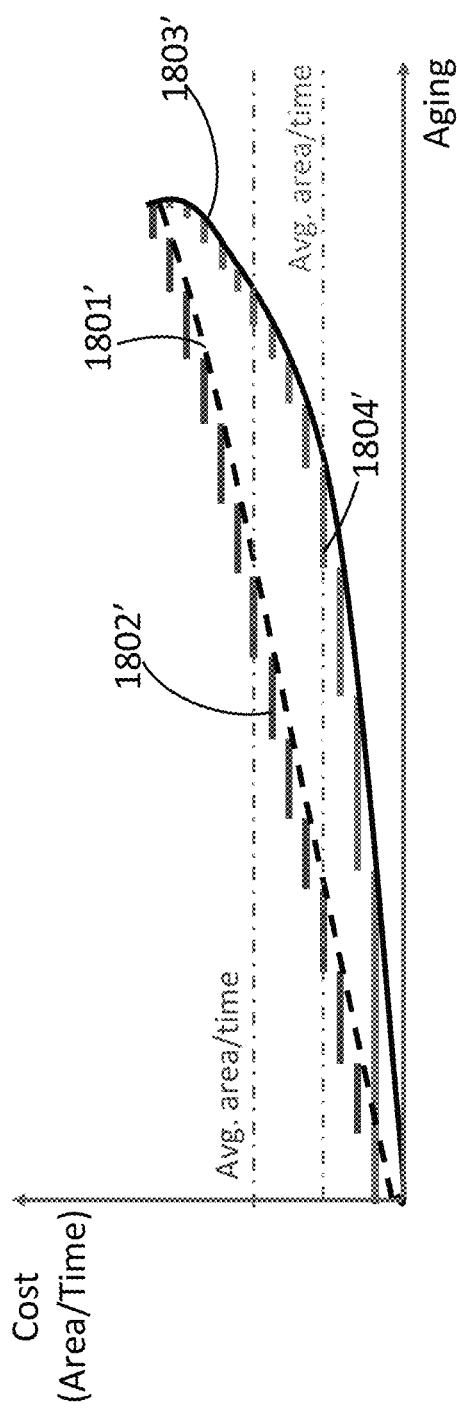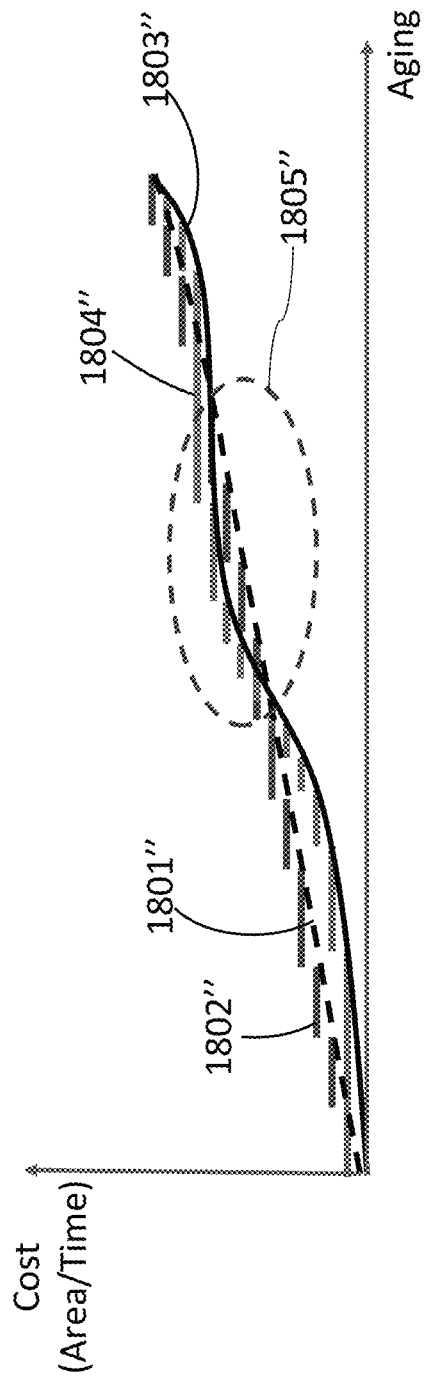

US 12,288,591 B2

MEMORY DEVICE HAVING AN IMPROVED ECC ARCHITECTURE

PRIORITY INFORMATION

This application is a National Stage Application under 35 U.S.C. § 371 of International Application Number PCT/IB2021/020010, filed on Mar. 2, 2021, the contents of which are incorporated herein by reference.

TECHNICAL FIELD

The present disclosure relates generally to the management and operation of an array of memory cells, and more particularly to memory devices having an improved ECC architecture.

BACKGROUND

Memory devices are used in many electronic systems such as mobile phones, personal digital assistants, laptop computers, digital cameras and the like. Various types of memories are used in memory devices, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Nonvolatile memories retain their contents when power is switched off, making them good choices in memory devices for storing information that is to be retrieved after a system power-cycle. In particular, non-volatile memory cells may maintain their stored logic state for extended periods of time even in the absence of an external power source.

The information is stored by programming different states of a memory device. For example, binary devices have two states, often denoted by a logic "1" or a logic "0." In other systems, more than two states may be stored. In order to access the stored information, a component of the memory device may read, or sense, the stored state. In order to store the information, a component of the memory device may write, or program, the logic state.

Improving memory devices may include increasing memory cell density, increasing read/write speed, increasing reliability, increasing data retention, reducing manufacturing costs, scaling smaller than traditional devices, as well as reducing power consumption.

Memory cells have varying physical and electrical characteristics during their life cycle due to various factors such as number of accesses, quality of the manufacturing process, environmental factors, and the like. Error Correction Code (ECC) is usually calibrated on a defined status of the cells of the memory device (e.g., end-of-life reliability of the cells), and therefore is generally used at its highest correction power. Consequently, there is often an excessive power consumption in memory devices. It is thus desirable to improve power consumption performances over the entire life of the memory device.

BRIEF DESCRIPTION OF THE DRAWINGS

FIGS. 5A and 5B are graphs showing power consumption versus time and payload quantity versus time, respectively, as a result of techniques according to an embodiment of the present disclosure;

FIGS. 15A and 15B are flow diagrams representing techniques for selecting an ECC protection level based on a lifetime counter, according to different memory technologies;

FIGS. 18A and 18B are schematic exemplary graphs representing cost of an implemented ECC protection level selection technique versus aging of the cells of the array.

DETAILED DESCRIPTION

With reference to those drawings, memory devices having an improved ECC architecture will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines. Access circuitry can differentiate between different logic states of a memory cell. For example, in case of a memory read, the access circuitry applies a voltage pulse with a particular magnitude and polarity to access lines, which results in an electrical response that dedicated sense circuitry can detect. Detecting electrical responses can include, for example, detecting one or more of a voltage drop (e.g., a threshold voltage) across terminals of a given memory cell of the array, current through the given memory cell, and a threshold event of the given memory cell.

In the present disclosure, the term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

Figure 1:
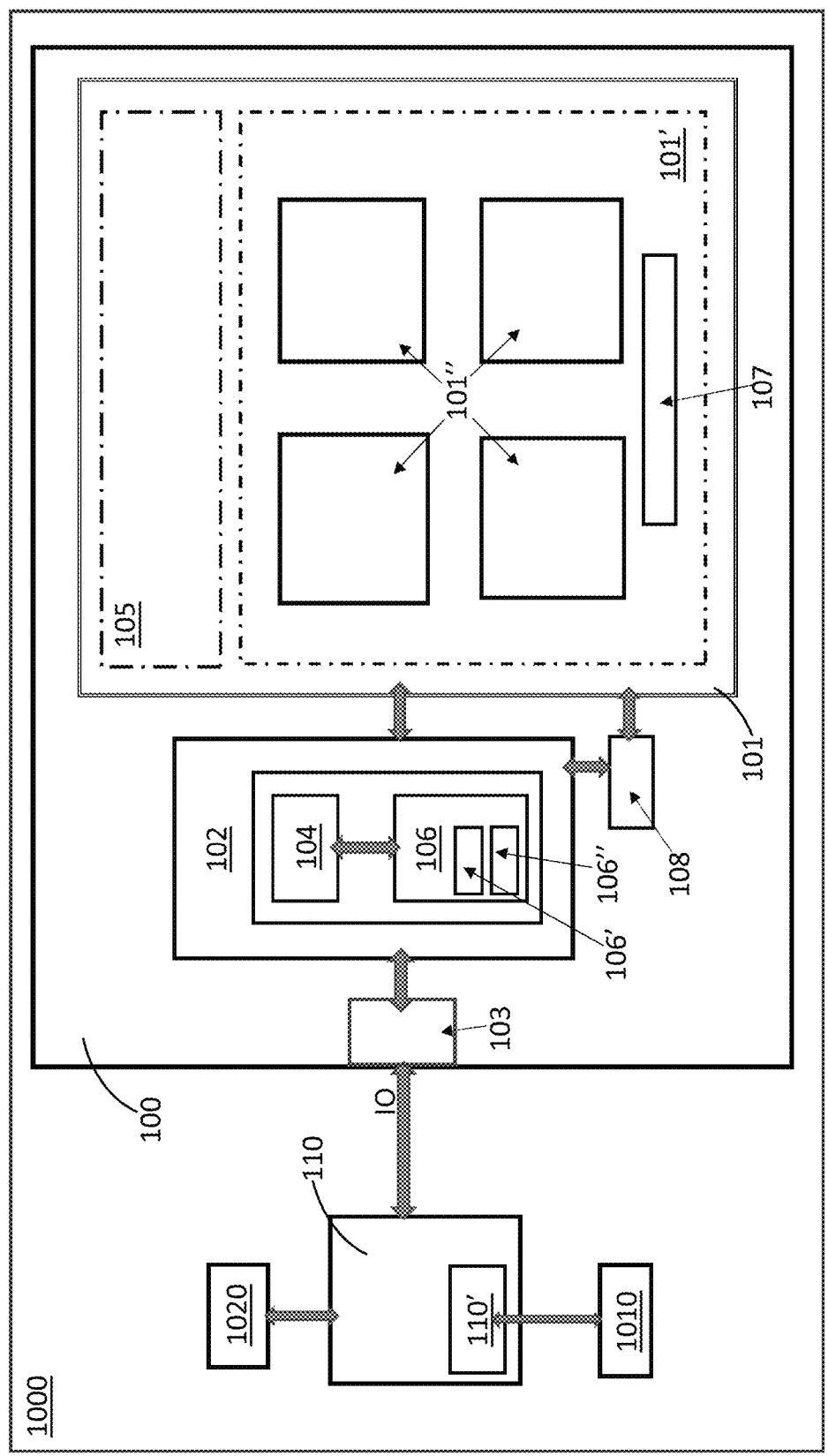
FIG. 1 is a schematic block diagram of a system comprising a memory device that may be operated according to the present disclosure.

FIG. 1 is a schematic high-level block diagram of a system 1000 comprising a memory device 100 according to an exemplary embodiment of the present disclosure, this memory device 100 being arranged, programmed and configured to perform the ECC techniques disclosed below and having dedicated ECC circuit portions.

The memory device 100 can be a solid-state drive (SSD), for instance, and can include a memory section 101, a controller 102, and a host interface 103. The memory section 101 is not limited to a particular architecture and can include different types of memories.

The controller 102 may be coupled to the host interface 103 and to the memory section 101 via a plurality of channels and can be used to transfer data between the memory section 101 and a host 110. The host interface 103 can be in the form of a standardized interface. For example, when the memory device 100 is used for data storage in a computing system, the host interface 103 can be a serial advanced technology attachment (SATA), peripheral component interconnect express (PCIe), or a universal serial bus (USB), among other connectors and interfaces. In general, the host interface 103 can provide an interface for passing control, address, data, and other signals between the memory device 100 and the host 110.

The controller 102 can include an embedded firmware and is adapted to internally manage and control the operation of the memory section 101. The controller 102 can communicate with the memory section 101 to control data read, write, and erase operations, among other operations. For example, the controller 102 can include a number of components in the form of hardware and/or firmware (e.g., one or more integrated circuits) and/or software for controlling access to the memory section 101 and/or for facilitating data transfer between the host 110 and said memory section 101.

The memory controller 102 thus represents control logic of the device, for example acting in response to command by the host 110 (which may generally be an external managing system of the non-volatile memory). As will be disclosed in the following, in one embodiment, the memory controller 102 can also be implemented in the host 110, in particular as part of a host processor 110', even if the present disclosure is not limited by a particular architecture.

As disclosed in relation to FIG. 1, the memory controller 102 may receive user data through input/output IO. Multiple signal lines couple the memory controller 102 with the memory section 101. For example, such signal lines may include clock, command/address and write data (DQ), read DQ, and zero or more other signal lines. The memory controller 102 may thus be operatively coupled to the memory section 101 via suitable buses.

The memory device 100 can also comprise other components (not shown) such as processor units coupled to the controller 102, antennas, further connection means with the host device 110, and the like. In any case, the present disclosure is not limited by a specific configuration of the memory device 100.

Moreover, the controller 102 can also include its own memory section (not shown) operatively coupled with other units thereof. In any case, the present disclosure is not limited by a particular configuration of the controller 102.

The memory device 100 may be a portable device configured to be coupled to the host device 110. However, in other embodiments not shown in the drawings, the memory device 100 can also be embedded within one or more host devices. The host 110 may be for example a personal computer, a tablet, a smartphone, a server or the like. The host 110 can include a system motherboard and/or backplane and can include a number of memory access devices (e.g., a number of processors).

In an embodiment, the controller 102 includes an Error Correction Code (ECC) unit 104, also referred to as ECC engine, which is structured and configured to operate according to techniques as described in the following.

The ECC unit 104 can include error correction circuitry and logics to detect and correct a number of bit errors, according to embodiments of the present disclosure. The ECC unit 104 is not limited to circuitry (e.g., hardware) implementations. For instance, in addition, the ECC unit 104 can be implemented in firmware, and/or software.

The ECC unit 104 can be embodied by discrete components such as an application specific integrated circuit (ASIC) or by components that reflect functionality provided by circuitry within the controller 102 that does not necessarily have a discrete physical form separate from other portions of the controller 102. Although illustrated as components within the controller 102, the ECC unit 104 can be external to the controller 102 or can have a number of components located within the controller 102 and a number of components located external to the controller 102, wherein the present disclosure is not limited by a specific hardware architecture. The ECC unit 104 can include separate encoding and decoding components, in a number of embodiments. In general, the memory device 100 thus comprises an operating unit (or operating circuit), indicated as 104, which is an ECC engine (which in turn may be coupled to the controller 102).

In other words, the error detection/correction circuitry of the ECC unit 104, which may be programmed as disclosed below, can include hardware logic to implement an ECC to detect errors occurring in data read from memory section 101. In one embodiment, error detection/correction circuitry also corrects errors (up to a certain error rate based on the implemented ECC code).

The memory section 101 of the memory device 100 can be a flash memory including an array of memory cells, for example a NAND memory, NOR memory, AND memory, and the like. Additionally or alternatively, memory section 101 may comprise bit alterable memory cells; for example, Phase Change Memory (PCM), Ferroelectric Memory (Fe- RAM), Magnetic Memory (MRAM), chalcogenide-based Self Selecting Memory (SSM), etc. Any kind of memory may be employed in embodiments of the present disclosure. For example, the disclosure applies to either or both non-volatile and volatile memories.

In general, the memory section 101 may comprise an array of memory cells 101'. Non-volatile memories may comprise a plurality of blocks, each block being indicated herein with the reference number 101" and comprising a defined number of pages. For the sake of simplicity, only four blocks 101" are shown in the example of FIG. 1.

The memory section 101 represents the memory resource for the memory device 100. In one embodiment, the array of memory cells 101' is managed as rows of data, accessed via wordline (rows) and bitline (individual bits within a row) control. The array of memory cells 101' can be organized as separate channels, ranks, and banks of memory, in general in a plurality of portions, as previously disclosed. Channels are independent control paths to storage locations within memory section. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In other words, according to an embodiment of the present disclosure, the array of memory cells 100' may be subdivided into a plurality portions, such as a codeword, a page, a single block, a group of blocks, or even all blocks (i.e., all the cells), the invention not being limited thereto. The memory cells can thus be grouped, for instance, into a number of blocks including a number of physical pages. A number of blocks can be included in a plane of memory cells and an array can include a number of planes.

Embodiments are not limited to a particular type of memory array or array architecture and the techniques of the present disclosure may be applied to several memory technologies (e.g., planar, cross-point, 3D, etc.).

Memory section 101 may also comprise a further circuit 105 operatively coupled to the array of memory cells 101'.

In one embodiment, the circuit 105 includes access circuitry and sense circuitry to detect electrical responses of the one or more memory cells to an applied read voltage. In one embodiment, the sense circuitry includes sense amplifiers. FIG. 1 illustrates the circuit 105 as being embedded in the memory section 101; however, other embodiments can include access circuitry and/or sense circuitry that is separate from the memory section 101. For example, access circuitry and sense circuitry can be included in a memory controller such as the memory controller 102.

Furthermore, the memory device 100 may comprise a counting unit 106 configured to account for the status of the memory cells of the array of memory cells 101' and for determining a trigger event to activate the ECC unit 104.

More in particular, the counting unit 106 may comprise a first counter 106' and a second counter 106". The first counter 106' may be configured to account for the lifetime of the array of memory cells 101' (or of portions thereof), as it will be disclosed below. For example, the first counter 106' may be apt to count the number of accesses, or the number of refresh events, or the number of power-up events, or a combination thereof, in accordance with embodiments disclosed below. The second counter 106" may be configured to count the number of errors detected by the ECC unit 104, in accordance with embodiments disclosed below.

In the example of FIG. 1, the counting unit 106 is depicted as integrated into the controller 102, even if other architectures are possible and the counting unit 106 may also be external to the controller 102 and connected thereto, or it may be integrated in the ECC unit 104.

Furthermore, the memory device 100, in particular the array of memory cells 101' of the memory section 101, may comprise a non-volatile region 107 apt to store operating information, for example for the management of the memory array according to embodiments disclosed in the following.

In one embodiment, the memory device 100 may also comprise a sensing unit 108 comprising one or more sensors operatively coupled to the memory section 101 and optionally to the controller 102. The sensing unit 108 may be configured to detect a status (e.g., the temperature) of the array of memory cells 101' or of a portion thereof.

Generally, the particular architecture of the memory device 100 may vary according to the needs and/or circumstances without limiting the scope of the present disclosure.

The host 110 and the memory device 100 may form the system 1000. As mentioned before, the host device 110 is a computing device in accordance with any embodiment described herein, and can be a laptop computer, a desktop computer, a server, a gaming or entertainment control system, a scanner, copier, printer, routing or switching device, embedded computing device, or other electronic device such as a smartphone. The host 110 may generally be a system managing the memory section 101, which may be embedded in said system or generally managed by said system. The memory device 100 may thus be managed by an external controller, i.e., the controller embedded in the processor 110' of the host 110, as previously disclosed, so that the ECC unit may also be included in said external controller. In this case, the controller of the memory device may not be present and the memory device 100 (which may be embedded in the host 110) communicates the required information to the external controller.

In one embodiment, the system 1000 includes an interface 1010 coupled to the processor 110', which can represent a higher speed interface or a high throughput interface for system components that needs higher bandwidth connections, and/or graphics interface components. Graphics interface interfaces to graphics components for providing a visual display to a user of system 1000. In one embodiment, graphics interface generates a display based on data stored in the memory device or based on operations executed by processor or both.

The system may also comprise network interface 1020 communicatively coupled to the host or to memory device for example for connecting with other systems, and/or a battery coupled to provide power to said system.

According to the present disclosure, the ECC unit 104 may be configured to perform an ECC operation (detection and/or correction of errors) with a certain error correction capability on a codeword stored in the memory section 101, wherein the codeword includes a certain number of parity cells or bits, as it will be disclosed in the following. The ECC capability may vary dynamically with time for a given memory portion, requiring a correspondingly varying number of selected parity cells between a minimum and a maximum (respectively associated to a smallest and a largest ECC capability for the stored payload). Payload may be stored in at least part of the parity cells which are not selected to store parity data, e.g., in unused parity cells. At ECC capability changes, possibly triggered based on a varied status of memory cells, unused parity cells and parity memory cells are made available for storing ECC information and the payload stored therein may be relocated.

Based on a selected ECC protection level, only some portions of encoding and/or decoding circuits are activated, while other portions (configured for encoding or decoding with an ECC protection level different from the selected one) are deactivated. A number of parity bits, the number based on the selected ECC protection level, is used; unused parity cells may be used for storing extra payload.

Figure 2:
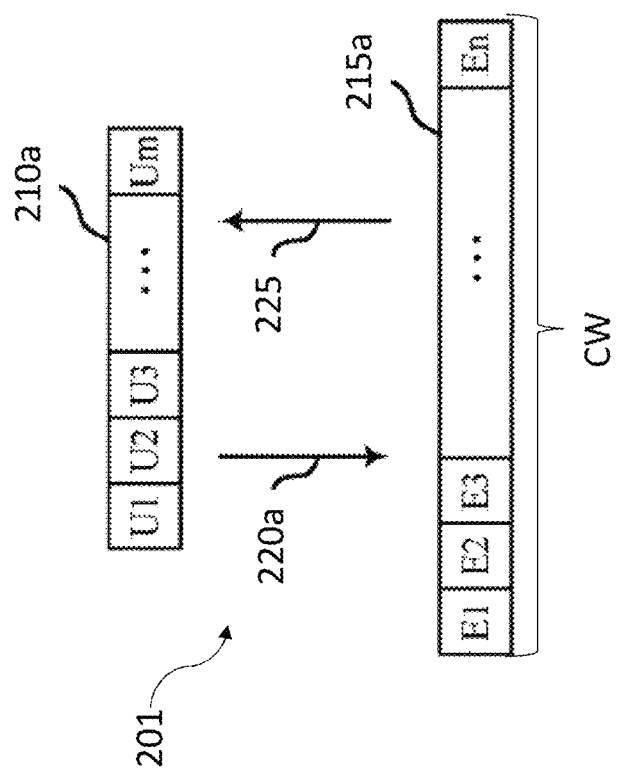
FIG. 2 is an example of user data pattern encoded according to embodiments of the present disclosure.

FIG. 2 illustrates an exemplary user data pattern diagram 201. The user data pattern diagram 201 includes user data 210a and encoded user data 215a. Encoding process 220a, which is performed in the programming phase of the array of memory cells, may convert the user data 210a (U1, . . . , Um) into the encoded user data 215a (E1, . . . , En). The encoded user data 215a may be stored in a set of memory cells, which may be, for example, memory cells of the memory section 101 of FIG. 1. Each box of the encoded user data 215a may correspond to a memory cell that may exhibit a logic state of 1 or a logic state of 0. In embodiments of the present disclosure, during the encoding process 220a, a number of parity bits may be added to the user data (or payload) 210a. A number of bits in the encoded user data 215a may be greater than the number of bits in the user data 210a (e.g., n is larger than m if some bits, e.g., parity bits, are added). Process 225 may convert the encoded user data 215a back to the user data 210a after the encoded user data 215a have been accurately read.

In an embodiment, the plurality of encoded bits to be read represents a codeword (CW). The codeword may be programmed to include various information to be used during the reading phase. In order to keep a smooth and simple description, in the following, reference will be made to ECC-related information only. It is understood that the additional bits may also include not strictly ECC-related information, though. Examples may include encryption bits, scrambling bits, bits for balanced or quasi-balanced codes (e.g., to achieve a predefined percentage, or within a percentage range, of bits in a given logic state, such as 50% of 1s or 0s), and/or other purpose additional bits.

As mentioned before, when digital data are stored in non-volatile memory (such as the array of memory cells 101' of FIG. 1), data are encoded in such a way that a decoder can identify and correct errors, i.e., data strings are encoded by adding a number of parity bits. When the original data is to be reconstructed, the decoder examines the encoded message to check for any errors. In certain embodiments, a block of user data bits is encoded to become a block of n bits (i.e., the codeword CW), as shown in FIG. 2. However, various encoding schemes are possible.

During the lifetime of the memory array, the Bit Error Rate (BER) associated with the data stored in the memory cells evolves based on several factors, such as, for example, a number of accesses to the memory cells, process quality, environment (space, power supply voltage, operating and storage temperature, etc.), and the like. For some technologies, the BER is typically better at the beginning of the die life and worst at the end of life, while, for some others, the BER could be better after some cycles than at the beginning and at the end of life of the die.

The present disclosure provides devices and systems to tailor the evolution of the BER and to enable a lower ECC protection when the BER is low and to increase said protection when the BER is higher. The present disclosure thus provides a technique to precisely define the ECC correction capability (or ECC protection level) to be applied to the cells of a memory array according to the status thereof. More in particular, the present disclosure provides examples of system architecture and design to manage the abovementioned ECC operation. In the context of the present disclosure, the "status" of a cell is meant as its operating condition or generally its health. As mentioned above, often the status of a memory cell or a plurality of memory cell may depend on several present and past parameters. The principles of the present disclosure may be applied to several types of volatile or non-volatile memories which show a time-varying status of their memory cells.

On the basis of the encoding scheme, a codeword is generated (e.g., as in process 220a) by manipulating the user data bits and adding a number of parity bits, the number of added parity bits depending on the ECC correction capability (the more potential errors are to be detected and corrected, the more parity bits are necessary). The ECC unit 104 may generate the codeword according to the selected ECC level. According to the disclosure, the ECC correction level and the number of additional parity bits (that are intrinsically tied) may vary in operation (and thus the used number of parity cells may vary in operation). Based on the decoding scheme, an ECC syndrome is produced from the encoded set of user and parity data, for instance by means of the ECC unit 104 of FIG. 1. The ECC syndrome changes depending on the presence and location of errors. When errors are detected, the ECC unit 104 is able to correct said errors up to and according to the implemented correction capability. In some cases, the presence of an uncorrectable error (e.g., the location of which is unknown) may be reported.

The number of used parity bits and the ECC correction capability are, therefore, intrinsically tied to each other. When programming a data into memory, the desired level of ECC protection (correction capability) can be selected and a corresponding number of parity bit cells allocated for storing the parity information can thus be selected. Unused parity cells may be allocated for (additional, e.g., extra) payload storage. According to some embodiments, payload may be increased when a lower ECC capability is used. When ECC capability is possibly increased, for example based on an increase of cells' aging or failure rate, the memory cells for storing the more parity bits needed are reclaimed and the payload stored therein may be relocated.

At read back, the codeword (e.g., including user codeword data, additional or extra payload data stored in unused parity bit cells, and parity bits used during the encoding phase) is accessed and decoded according to the ECC scheme applicable to that memory portion. An ECC engine (implemented in hardware, for example) with a given maximum correction capability may operate at different correction capabilities each requiring a corresponding number of parity bits. For example, less or more parity bits may be considered either in encoding or decoding for a lower or higher ECC protection level, respectively; correspondingly, a smaller or higher power is consumed.

Figure 3:
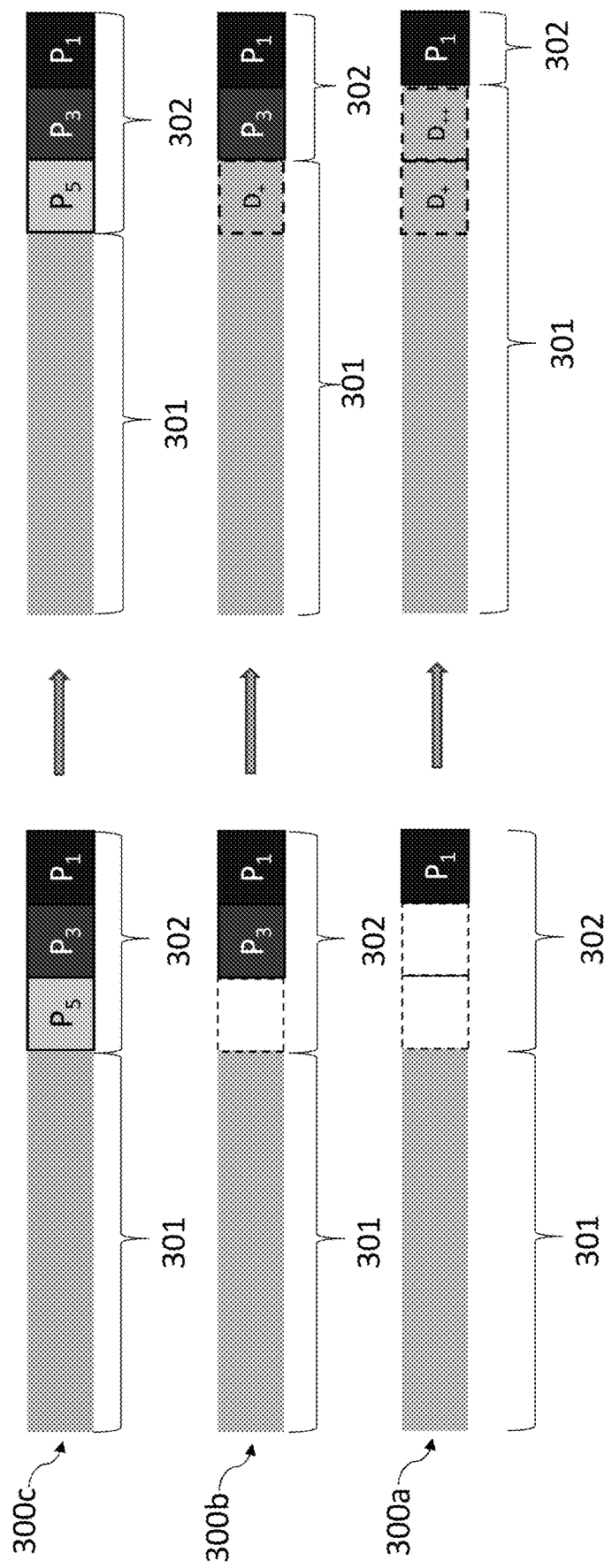
FIG. 3 shows examples of selection of a number of parity cells and payload quantity in a codeword according to embodiments to the present disclosure.

Referring now to FIG. 3, according to an embodiment of the present disclosure, the ECC protection level is selectable according to the status of the cells of the memory array. In other words, the ECC protection is adapted to the memory cell health and is increased only when necessary, i.e., when the status of the cells requires it.

As shown before, when user data (i.e., the payload content of a codeword) are stored in a plurality of memory cells of the memory array, also parity data are stored in parity cells of the memory array associated with the user data. The number of used parity cells is selected based on the status of the plurality of memory cells, this selected number being related to the required ECC protection level, e.g., the desired or selected ECC correction capability. The ECC operation is then performed based on the selected number of parity cells, i.e., on the basis of the stored parity bits, which may vary according to the cell health.

More in particular, the used parity cells (i.e., the stored parity bits) are selected between a defined maximum number and a defined minimum number, so that the number of unused parity cells is given by the difference between the maximum defined number and the used number of parity cells. According to an embodiment, the unused parity cells (which are adapted to store parity bits corresponding to higher ECC protection levels) are used to store extra payload content.

In other words, when the payload is stored, parity data are associated with the payload; in particular, a minimum number of parity cells to be used is defined, the minimum number of parity cells corresponding to the minimum ECC correction capability, and a maximum number of parity cells to be used is defined, the maximum number of parity cells corresponding to the maximum ECC correction capability. Based on the current status of the memory cells storing the payload, the number of parity cells to be used for storing the parity data is selected between the minimum number and the maximum number.

Intermediate number(s) of parity cells corresponding to intermediate ECC correction capability level(s) may be also used. Memory cells that are not selected to store parity data (e.g., unselected parity data memory cells) are instead used for storing, at least in part, the payload; accordingly, more storage capability is provided.

As shown in FIG. 3, a codeword may comprise a first codeword portion 301 corresponding to the payload (thus including encoded user data), and a second codeword portion 302 corresponding to the parity data. It is noted that such a distinction may be somehow arbitrary; as a matter of fact, an encoding process (such as process 220a in FIG. 2) may combine and mix the user data and the parity data so that the codeword as a whole should be considered.

When a minimum ECC protection level is needed, only a reduced number of parity cells may be used, as in codeword 300a where only the cells indicated as $P_1$ are used to store parity bits (e.g., only a number of bits to calculate syndrome $S_1$ (see description below, for example with reference to FIGS. 10-14, for syndrome computation) corresponding to ECC1 is stored, wherein ECC1 may be an error correction code with correction capability of 1 bit, in some examples).

When ECC protection has to be increased, an increased number of cells may be used, as in codeword 300b, where an increased number of parity bits ($P_1$ and $P_3$) is stored to calculate syndrome $S_3$ (e.g., corresponding to ECC2, wherein ECC2 may be an error correction code with correction capability of 2 bits, in some examples).

When protection has to be at a maximum level, the number of used parity cells may be further increased, as in codeword 300c where an increased number of parity bits ($P_1$, $P_3$ and $P_5$) is stored to calculate syndrome $S_5$ (e.g., corresponding to ECC3, wherein ECC3 may be an error correction code with correction capability of 3 bit, in some examples), occupying the maximum number of parity cells, e.g., all the memory cells available for storing parity data are used. It is observed that a single block of the codeword portion 302 does not necessarily correspond to a single cell and may also corresponds to a group of cells, e.g., it generally represents the number of bits to calculate the syndrome for a corresponding ECC protection level. It should be understood that, while three levels of protection are depicted in FIG. 3 (e.g., ECC1, ECC2 and ECC3), any number may be conceived. For example, embodiments with higher (e.g., N>3) error correction capability and/or embodiments featuring no ECC protection at all (e.g., no parity bit added to the codeword for the purpose of error correcting it) are possible.

The reduction of the ECC protection level to the minimum necessary thus corresponds to the reduction of the number of used parity cells.

The present disclosure provides devices and systems to tailor the evolution of the BER and to enable a lower ECC protection when the BER is low and to increase said protection when the BER is higher and storing (additional, e.g., extra) payload in unused parity memory cells. For example, the disclosure teaches storing a payload in a plurality of memory cells of a memory array, defining a minimum and a maximum number of parity cells for storing parity data associated with the payload, the minimum and maximum number of parity cells respectively corresponding to a minimum and maximum Error Correction Code (ECC) correction capability, and, based on a current status of the memory cells, selecting a number of parity cells to be used for storing the parity data between the minimum number and the maximum number, wherein the payload is stored in at least part of the parity cells which are not selected to store parity data.

The ECC engine, that has a defined maximum error correction capability (either hardware or software limited) may be operated to an inferior error correction capability corresponding to the used number of parity cells, by activating only dedicated circuit portions, in some examples. The decoding unit may be configured to perform an ECC operation on the stored codeword based on the selected ECC protection level. The encoding unit and the decoding unit may comprise respective circuit portions configured to be selectively activable based on the selected ECC protection level and, in some cases, each circuit portion may be configured to manage a respective number of payload bits/cells and parity bits/cells of the codeword. Said it differently, whenever a lower (or higher) ECC protection level is desired, the corresponding number of parity cells $P_i$ is selected and used for storing parity information, and/or vice-versa. The ECC correction capability may be dynamically changed during the lifetime of the device; encoding, decoding and ECC circuit portions may be selectively activated to encode, decode and error correct the codeword according to the desired and needed ECC capability. Correspondingly, the number of used parity cells is adaptively changed so as to allow the ECC engine to work at the desired level. The number of stored payload bits is also dynamically changed.

As an example, in some cases, at the start of life of the array, ECC1 may be used and, at end of life, ECC3 may be used (and therefore an increased number of parity cells may be used). However, also different cases are possible, including cases in which at the start of life a maximum ECC protection level is needed and after some cycles (e.g. after seasoning or in general after usage of memory cells), the ECC protection level may be reduced.

As shown in the left portion of FIG. 3, the number of unselected (unused) parity cells of codeword portion 302 is given by difference between the maximum number of parity cells to be used and the actual used number (e.g., $P_1$ in 300a, $P_1$ and $P_3$ in 300b and $P_1$, $P_3$ and $P_5$ in 300c). As shown in the right portion of FIG. 3, payload may then be stored in at least part of the parity cells which are not selected (e.g., used) to store parity data, identified with dashed border in 300a and 300b. In this way, the stored payload content is dynamically adapted in a codeword according to the selected number of parity cells, i.e., based on the selectable ECC protection. The dimension of the codeword portion 301 thus varies according to the selected ECC protection level, in particular within a fixed length page.

As shown in FIG. 3, if the ECC parity bits are stored in a reduced number of parity cells, e.g., when low ECC protection level is needed (as in codeword 300a where only parity cells $P_1$ are used), the payload can be larger, e.g. groups of cells indicated as $D_+$ and $D_{++}$ can be used for storing extra payload content. Moreover, if the ECC protection level is increased, as in codeword 300b, payload is decreased and only parity cells $D_+$ can be used. Then, if the ECC protection level is maximum, as in codeword 300c, all the parity cells are used for storing parity bits and the payload content is minimum (i.e. codeword portions 301 of left and right sides of FIG. 3 have a same length). In this way, some parity cells are actually used as parity when a higher ECC protection level is required and as payload when lower ECC protection level is selected. Therefore, according to the present disclosure, when bits are stored in the memory cells forming a codeword, such codeword may exhibit a dynamic payload varying during die life, as the number of parity bits varies according to the selected ECC protection level.

For example, a maximum number of memory cells for storing the payload is used when the selected number of parity cells to be used is the minimum, and a minimum number of memory cells for storing the payload is used when the selected number of parity cells to be used is the maximum. In an embodiment, all the parity cells which are not used to store parity data are used to store extra payload content. However, in other embodiments, the memory may be programmed in such a way that the payload is stored only in a part of the unused parity cells.

The storage of extra payload content in unused parity cells has many benefits, since said unused cells are a cost in terms of area of the memory. The average available payload may be optimized according to the required reliability and is higher along the die life, as well as average read/write, refresh and wear levelling throughput are higher, as it will be shown in detail below. The dynamic payload allows obtaining a time-changing available space for data storage in the device, with increased average memory capacity during lifetime. Moreover, the dynamic payload also leads to a power reduction due to the possibility to access fewer pages and to the possibility of using smaller ECC decoder, as well as to a possible delay reduction in buffer filling.

Furthermore, different portions of the array of memory cells may have a different status and/or may exhibit different defect densities. According to an embodiment of the present disclosure, the memory cells of the array may be grouped into a plurality of portions, each portion being assigned a specific ECC protection level based on the status of the memory cells thereof. Different portions may thus have different ECC protection levels as well as a same protection level, depending on the specific circumstances. A "portion" of the array is therefore a group of memory cells having the same ECC protection level. In other words, the array may be split into portions in which the ECC correction capability is coherent but could be different from the ECC correction capability of another portion.

According to an embodiment, a memory portion may correspond to an internal subdivision like a bank group, a bank, a section or whatever other suitable internal subdivision of the memory. Moreover, the memory portion may also correspond to a specification/host subdivision like a buffer, a page, i.e. a subdivision at high level. In an embodiment, the whole memory array may be coherent in term of ECC correction capability.

In other words, a portion may correspond to one of a codeword, a bank, a bank group, a section of the array, the entire array, or even a buffer, a page, or a codeword, and the present disclosure is not limited by the way the cells are grouped.

The subdivision of the array into several portions, possibly having different ECC protection levels, is better suited to real memory devices and has many benefits.

Figure 4A:
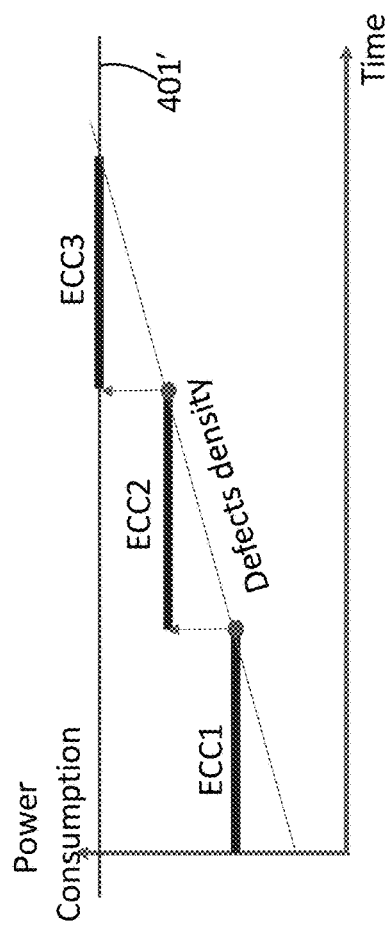
FIGS. 4A and 4B are graphs showing power consumption versus time and payload quantity versus time, respectively, as a result of techniques according to the present disclosure.
Figure 4B:
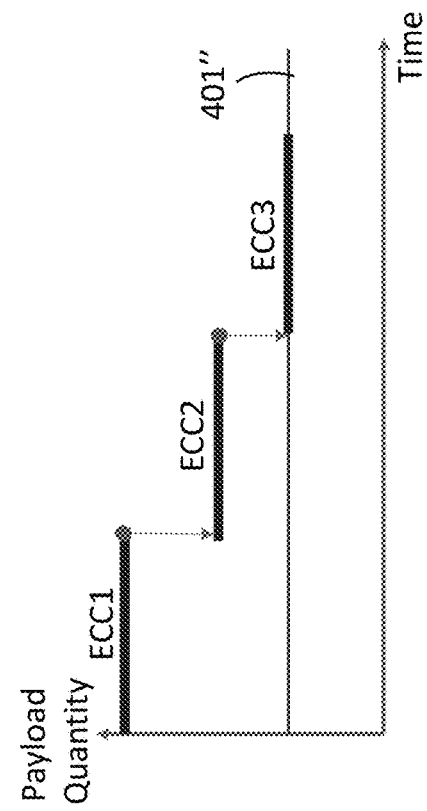

FIGS. 4A and 4B are graphs showing, on the Y axis, power consumption (or generally the cost of the ECC, FIG. 4A) and payload quantity (FIG. 4B) versus time, on the X axis, according to the present disclosure. It should be noted that, despite time is represented on the X-axis, the concepts herein disclosed are not limited to power consumption evolution vs. time and, rather, they apply to whichever factor that may potentially affect the Bit Error Rate of the memory cells (e.g., cycling, endurance, aging, exposure to high/low temperatures, hard/soft failure mechanisms, voltage drift, etc.; accordingly time is only one of many possible examples and the figure should be correspondingly broadly interpreted). In particular, in an example, the time increase may correspond to an increase in the defect density, as shown in FIG. 4A. The ECC protection level may then be varied during the life of the memory array; specifically, FIG. 4A is an example of a single portion of the array in which the starting protection level is low (e.g., ECC1, corresponding to a low power consumption), this starting ECC protection level being increased over time based on the increase in the defect density, e.g., the Bit Error Rate. It is also possible a situation (not shown in the drawings) in which the ECC protection level is lowered over time, depending on the specific technology of the memory. Line 401' of FIG. 4A represents the prior art average cost in terms of consumed power corresponding to the number of used parity cells, which is always at a maximum level, while according to the present disclosure the average power cost may be significantly reduced, since for a significant period of time the ECC protection level is not at maximum level. As shown in FIG. 4B, when a minimum ECC correction capability is selected (ECC1 at beginning of life, for example), there are unused parity cells available for storing payload that may be increased (e.g., to a maximum level at beginning of life) with respect to otherwise possible storage capability. At later time during life in the depicted example, when the ECC protection level is increased (e.g., to ECC2 and then to ECC3), the payload quantity may be correspondingly reduced to free parity cells for use in storing parity data information. Line 401" of FIG. 4B represents the prior art average payload quantity, which is constant and always at a minimum level, that is the nominal storage capacity, because the same (maximum) ECC protection level is used (e.g., ECC3), thus requiring the same (maximum) number of parity cells.

FIGS. 4A and 4B represent the behavior of a single portion (or generally of an array not divided into multiple portions), whereas FIGS. 5A and 5B represent a case in which the array is divided into multiple independent portions. As in FIG. 4A, line 501' of FIG. 5A represents the prior art average cost in terms of consumed power corresponding to the number of used parity cells, which is always at a maximum level. In the case of FIG. 5A, each step 502' corresponds to a single portion of the plurality of portions increasing its ECC protection level (different ECC correction capability may be independently selected for each portion), and plateau 503' represents an exemplary initial condition when all the portions have a minimum protection level (e.g. ECC1, even though a situation in which no ECC is initially implemented is possible). In this embodiment, the high granularity ensures better performances, as represented by line 504', which is the average power consumption, as compared with state of art represented by line 501'. Therefore, when increasing the granularity, smaller steps (corresponding to smaller portions) are possible, leading to a benefit increase. As shown in FIG. 5B, in a similar fashion as described with reference to FIG. 4B, when the ECC protection level is increased with time, the payload quantity is correspondingly reduced during the life of the memory, starting from an initial maximum available quantity (line 503"). In this case, smaller portions yield a significant benefit since the average available payload (represented by line 504") is much higher than state-of-art payload (which always corresponds to the minimum payload, line 501", constant during the whole life).

Figure 6:
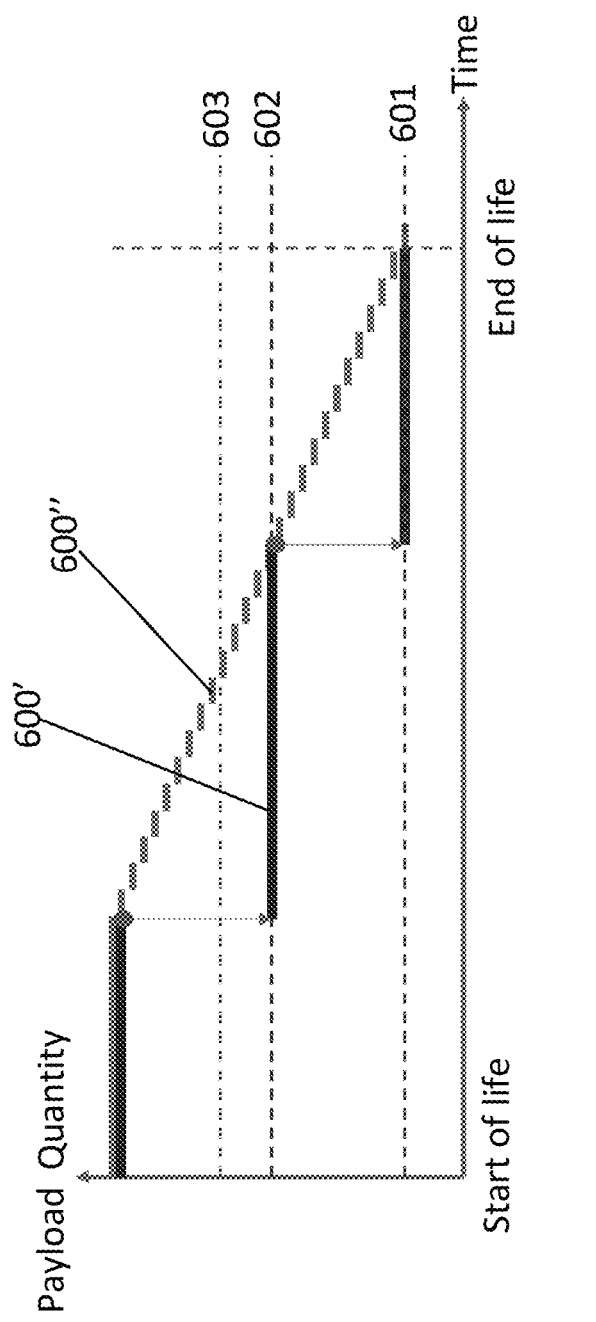
FIG. 6 is a comparison of payload quantity versus time as obtained according to different embodiments of the present disclosure.

FIG. 6 is a comparison of payload quantity versus time as obtained according to different embodiments of the present disclosure. The quantity of available payload using larger or smaller portions is shown, resulting in fewer but larger steps 600' and more but smaller steps 600", respectively. In FIG. 6, line 601 is the constant available payload with state-of-the-art technology, line 602 is the average available payload with larger portions, and line 603 is the average available payload with smaller portions. Therefore, increasing granularity (and thus using smaller portions) results in higher benefits in terms of average payload quantity, throughput and also power saving.

FIGS. 4A-4B, 5A-5B and 6 are examples showing a case in which the starting ECC protection level is low and then it is increased over time following the increase in defect density. It should be noted that, for improved graphical representation, the defect density or BER is depicted in FIG. 4A as a linearly increasing functions with time (e.g., a line with positive slope). This is not the typical case and it is understood that any BER variation profile may be considered, linear or not. According to the disclosure, the ECC protection level or correction capability is varied or adjusted based on a variation of the BER (e.g., at any time when it is necessary to do so), therefore insuring the optimal usage of the ECC engine in any circumstance. Alternatively or additionally, depending on the technology, the starting ECC protection level may also be higher (e.g., ECC3) at a given moment in time, such as at start of life, and it could be decreased over time (e.g., to ECC2 and/or to ECC1), so that said graphs could also have a decreasing trend for the power consumption and an increasing trend for the payload quantity. Moreover, the trend does not need to be monotonous; in some cases, the BER may initially increase and subsequently decrease or vice-versa, so that the selected ECC correction capability and the associated number of parity cells needed to store the parity information may also vary with a waving trend in time for any portion—e.g., the device configuration is constantly optimized during its lifetime.

In any case, according to the present disclosure, the memory (e.g. the ECC engine) is configured so that the ECC correction capability and the payload quantity are varied (increased or decreased according to the specific technology) with the lifetime of the memory cells array based on the time-varying status thereof, which has many benefits in terms of power consumption.

According to an embodiment, data information relating to the selected ECC correction capability is stored in one or more dedicated non-volatile region(s) of the memory array. In other words, the array comprises a non-volatile region adapted to store the data information relating to the selected ECC correction capability, in particular the selected ECC protection level for each portion of the array. For example, with reference to FIG. 1, the non-volatile region dedicated to store said information may be the non-volatile region 107 of the memory section 101.

More in particular, when the array is subdivided into a plurality of portions, respective data information relating to the selected ECC correction capability for each portion is stored in the non-volatile region (which may be a single region or may also be subdivided into multiple regions of the array).

In an embodiment, this data information is then stored in a look-up table in which each portion of the array is associated with its respective selected ECC correction capability. The information about the ECC protection level of each portion can thus be transferred in this lookup table containing the information of all the memory portions and their current ECC protection level, which simplifies the reading of this information.

In an embodiment, the codeword itself may comprise the information indicating its current ECC protection level, leading to an extreme granularity. In this way, any specific codeword may be encoded with additional information bits associated thereto and relating to the selected ECC correction capability for said codeword. In this embodiment, more space of the array is required to store the information about the ECC protection level of each codeword, but the power benefits are increased.

Generally, several ways to manage different encoding of codewords in various portions are thus possible, the information relating to the ECC protection level of each portion being then stored in the array. The encoding unit, the decoding unit and/or the ECC engine of the memory device may comprise respective circuit portions configured to be selectively activable based on the selected ECC protection level. Each circuit portion may be configured to manage a respective predetermined payload quantity of the codeword, said payload quantity being variable according to the selected ECC protection level. At least one selector element may selectively enable at least one circuit portion based on the selected ECC protection level and to selectively disable at least part of circuit portions relating to unselected ECC protection levels.

Figure 7:
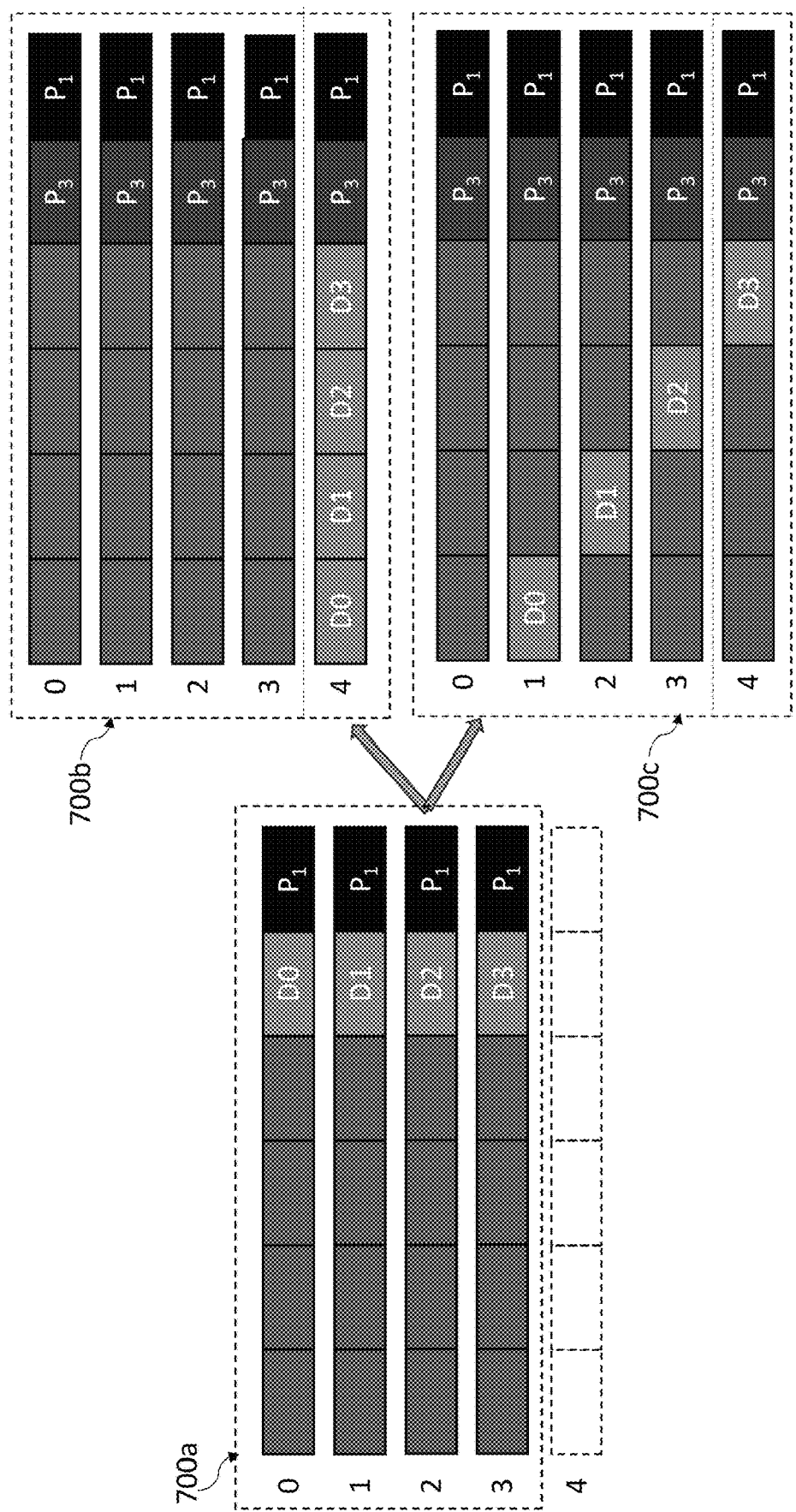
FIG. 7 shows examples of payload data relocation according to embodiments of the present disclosure.

As shown in FIG. 7, according to an embodiment of the present disclosure, at least part of the extra payload that is stored in the parity cells of one or more codewords is relocated in cells of one or more different codewords when the ECC correction capability is increased (and therefore when the number of stored parity bits in the original codeword—or in general of a given portion of the array—is increased). In fact, when the ECC protection switches to a higher level (for example due to an increase in defect density), the number of parity bits correspondingly increases so that extra payload data relocation is required and the payload initially stored in the parity cells is moved somewhere else, e.g., in other codewords of the array (e.g., in codewords in the same block). In this case, a page access may not return the same quantity of payload and more pages may be required to be accessed to obtain the same payload quantity. The data relocation is optimized if the memory portion comprises only full codewords.

As shown in FIG. 7, there are several possible relocation logic schemes starting from an initial configuration. In FIG. 7, the group of codewords 700a represents an exemplary initial configuration in which each codeword 0, 1, 2 and 3 initially has one group of parity cells $P_1$ (i.e., one or more parity cells) storing extra payload, which is indicated as D0, D1, D2 and D3, respectively. In this embodiment, the staring ECC protection level is ECC1, which is then increased to ECC2, as in cases described with reference to groups of codewords 700b and 700c having $P_1$ and $P_3$ parity bits. Other initial configurations are possible and the number of codewords involved is not limited to the one of the examples. Codewords 0, 1, 2 and 3 may be codewords of a single page.

More in particular, in an embodiment of the present disclosure, P3 parity bits of respective codewords 0, 1, 2, and 3 may be programmed in memory previously unused parity cells where for extra payload D0, D1, D2 and D3 was stored; the extra payload of codewords 700a (i.e., extra bits D0-D3) may be relocated in one or more new codewords (also having a same ECC correction capability, e.g., also having P1 and P3 parity bits, in the depicted example) and whose payload content is formed only by the relocated payload. In other words, according to example of the figure, all the relocated payload may be stored in codeword 4, as represented in case 700b, said codeword 4 being initially empty. This embodiment requires relatively small data relocation. In other words, in this example, the relocated payload is all stored in one (or more, depending on the number of codewords in the group of codewords) new codeword comprising only the relocated extra payload.

In the depicted example, only parity cells necessary for either ECC1 ($P_1$ parity bits) or ECC2 ($P_1$ and $P_3$ parity bits) correction capability are described (e.g., no other parity cells are depicted). It is understood that such additional parity cells (e.g., configured to store parity information for an even higher ECC correction capability—for example, cells $P_5$ for an ECC3, not shown) may be present and may continue to store payload (e.g., payload in addition to nominal storage capacity) that in turn will possibly be relocated at a subsequent time, when the ECC protection level is further increased, reclaiming parity cells. In any case, the approach described above may be particularly beneficial when the memory portions (e.g., the groups of codewords) are configured and/or dimensioned so as to accommodate the relocated payload bits in a full codeword, or in an integer number of codewords or pages, for example.

In another embodiment, as shown in case 700c, different bits of the relocated payload (e.g., bits D0-D3) are stored in respective different codewords (also having a same increased ECC correction capability) according to a relocation sequence. In this case, the codewords housing the relocated payload comprise a mix of originally stored payload and part of the relocated extra payload (e.g., codewords 1, 2, 3, and 4 of group 700c), each of this extra payload bits being assigned a defined position in the respective codeword, in this way defining a sequence of relocated bits positions. In other words, different bits of the relocated payload are stored in single respective different codewords according to the relocation sequence, each relocated bit having its position in the respective codeword which may be different from the position of other relocated bits in other codewords. Also in the example depicted with reference to this approach, no mention of possible other parity cells is made. It is understood that, at intermediate ECC correction capability, memory cells (not shown) unused for higher ECC protection level may be used for partial additional payload storage and will be freed for storing parity information at a possible subsequent increase in ECC correction capability; relocation of the partial additional payload stored therein will be implemented, for example according to a second relocation sequence.

According to an embodiment of the present disclosure, the adopted relocation scheme is stored in a look-up table which is used to reconstruct the proper data pattern according to the selected ECC protection level. Therefore, the change in the ECC protection level may correspond to a different available space or a different location of data, so that this table is used for a correct mapping of data as it contains the correspondence between the location of data bits and the selected ECC protection level. In other words, the logical to physical mapping table also accounts for the selected ECC correction capability properly considering the corresponding number of parity bits necessary for the ECC engine, and the relocation sequence for payload bits initially stored in unused parity cells (as well as additional payload possibly stored in parity cells still unused for parity information storage, if any).

In any case, the present disclosure is not limited by a particular relocation scheme, and FIG. 7 represents only exemplary embodiments, other schemes being therefore possible, wherein, generally, the operating unit of the device of the present disclosure is configured to relocate extra payload as disclosed above needed.

Moreover, according to an embodiment of the present disclosure, read and/or write access time to the memory cells of the array may be varied based on the number of parity cells used for storing the payload in codewords of a portion. In other words, the operating unit of the present disclosure is configured to dynamically vary and adapt the read and/or write access time to portions of the array based on the selected ECC protection level of said portions. Faster (slower) encoding, decoding and/or error correction may be performed by selectively activable dedicated circuit portions when lower (higher) ECC capability is applied. Additionally and/or alternatively, more (less) payload data may be available based on the selected ECC capability; for example, with reference to case 700a, access to four codewords (0, 1, 2 and 3) also provides data content of a fifth codeword (bits D0, D1, D2 and D3, stored in unused parity bits of codewords 0-3).

When the ECC protection level is decreased (as it may be when the bit error rate is low, for example at the beginning of lifetime), the access to the same quantity of payload may require less time and less power consumption with respect to the conventional approach as it is possible to access (sense or program) less codewords for a given amount of data (since for instance part of payload bits have been or are stored in unused parity cells, as shown in FIG. 7), so that the memory throughput is increased. This advantage is added to the reduced energy consumption associated with less computation being performed by the less powerful ECC engine. The benefits persist even at intermediate ECC correction capability as described above. Performance is "reduced" to the prior art performance only when the ECC engine works at its highest correcting power (therefore also requiring all the allocated parity bits); in any case, the average performance is greatly improved, especially when a granular partitioning of the memory array is adopted.

Figure 8:
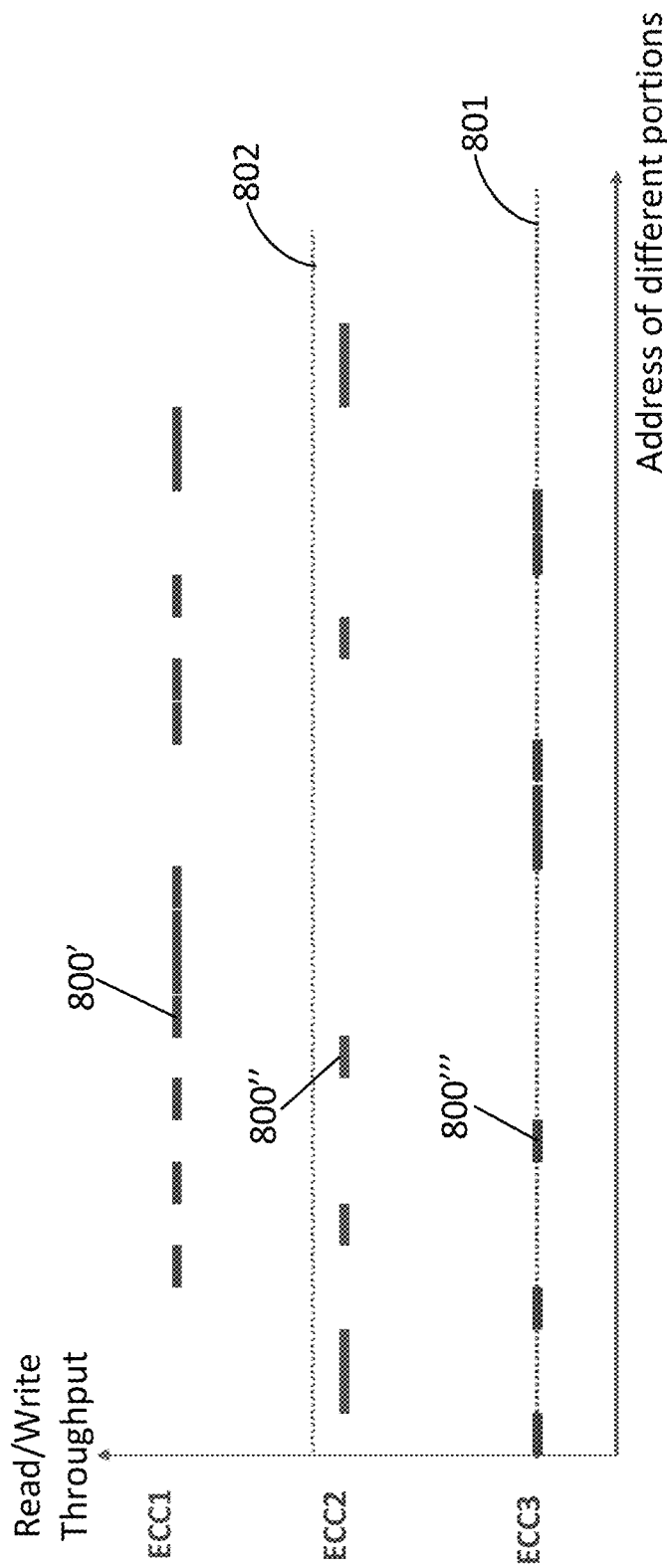
FIG. 8 shows different data throughputs based on the selected ECC protection level.

As shown before, the array may be divided into a plurality of portions which are represented in FIG. 8, showing, at a certain time, the throughput of different portions having different ECC protection levels, wherein in this graph each portion is identified by its address. More in particular, each portion (represented by segments 800' for portion having ECC1, segments 800 for portions having ECC2 and segments 800" for portions having ECC3) has a proper address which is represented by the position of segments 800'-800" with respect to the x-axis of the graph. In other words, in FIG. 8, each segment has a proper position along the x-axis corresponding to the specific address of the portions of the array, wherein each portion as a defined ECC protection level. Different regions of the memory have therefore different read/write throughputs.

The portions having a lower protection level have a higher payload content and therefore a higher throughput, e.g., the highest throughput is for portions with ECC1, as shown in FIG. 8. When ECC protection level is increased, throughput is decreased. As represented by line 801, the state-of-the-art techniques only provide for the highest protection level and therefore the lowest throughput. Line 802 is an exemplary average throughput at a certain time according to the dynamic payload approach of the present disclosure, which is higher compared to constant state of the art throughput of line 801.

In this case, a faster access time may be used for portions with higher throughputs, whereas a slower access time may be used for portions with lower throughputs, so that the average read/write access time may be optimized with respect to a case in which a constant access time is adopted. In other words, different portions having different addresses and different payload quantity may be accessed with different access times, leading to an even increased read/write throughput benefit. For example, a system controller or a user may rely on faster access times in portions protected by lower ECC correcting capability by selectively programming into those portions data that needs to be stored and/or retrieved more efficiently, e.g., with shorter latency.

Therefore, a variable read/write access time based on the selected ECC protection level of each portion leads to better performances and allows to best exploit all the potentialities of dynamic payload approach, so that the best fit is obtained with this dynamic read/write access time memory, i.e., with different packet access speed. The average throughput 802 thus corresponds to an average access time which may be much higher than the static payload case.

According to embodiments of the present disclosure, a memory device configured to handle codewords having different payload quantities, having different ECC protection levels, coming from a same memory address, and having a same overall length is provided.

Figure 9:
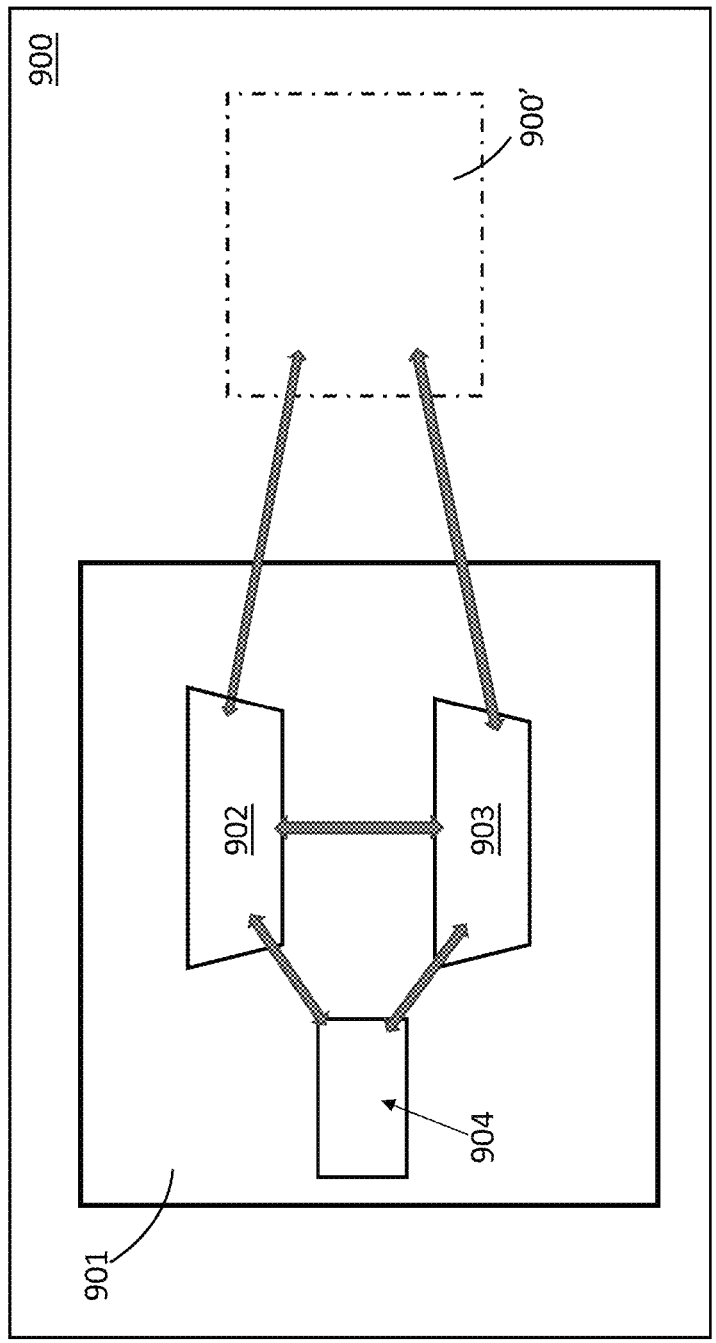
FIG. 9 is a schematic block diagram of an operating circuit for managing ECC operation according to an embodiment of the present disclosure.

As shown in FIG. 9, a memory device 900 (which may correspond to memory device 100 of FIG. 1) comprises an operating circuit 901 for managing the operation of an array of memory cells 900', which may correspond to array 101' of FIG. 1. The operating circuit 901 may be part of a controller of the device, such as controller 102 of FIG. 1, or may be external to the controller, or can have a number of components located within the controller and a number of components located external to the controller, wherein the present disclosure is not limited by a specific hardware architecture.

The operating circuit 901 (which may correspond to ECC unit 104 of FIG. 1) can include error correction circuitry and logics to detect and correct a number of bit errors (up to a certain error rate based on the implemented ECC code), according to embodiments of the present disclosure. The operating circuit 901 can be embodied by discrete components such as an application specific integrated circuit or by components that reflect functionality provided by circuitry within the controller that does not necessarily have a discrete physical form separate from other portions of the controller. Therefore, in the present disclosure, the term "operating circuit" is used in a general and nonlimiting way.

The operating circuit 901 can include separate encoding and decoding components, in a number of embodiments. More in particular, as shown in FIG. 9, the operating circuit 901 comprises an encoding unit 902 configured to generate a codeword according to encoding schemes. The codeword may comprise payload data to be stored in a plurality of memory cells and parity data associated with the payload data to be stored in parity cells, wherein a number of parity cells to be used to store the parity data is selected based on the status of the plurality of memory cells and is related to a corresponding ECC protection level. The used parity cells are selected among a minimum number (corresponding to a minimum ECC protection level) and a maximum number (corresponding to a maximum ECC protection level). The codeword may further comprise extra payload data to be stored in unused parity cells.

The operating circuit 901 further comprises a decoding unit 903 configured to perform an ECC operation (such as bit error detection and/or correction) on the stored codeword based on the selected ECC protection level. Therefore, the operating circuit 901 is able to generate a codeword comprising payload data and parity data corresponding to one or more ECC protection level via the encoding unit 902 and to process said codeword via the decoding unit 903, which is configured to handle codewords having a variable payload quantity, as disclosed above.

The encoding unit 902 and the decoding unit 903 may be operatively coupled to each other and to the array 900'. The encoding unit 902 and the decoding unit 903 may be integrated in the controller of the memory device or may be separate components possibly coupled with the controller (and therefore they may not necessarily be integrated in a same component).

The operating circuit 901 may further comprise a logic unit 904 configured to perform logic operations on payload bits and parity bits stored in the array 900'. The logic unit 904 may be operatively coupled to the encoding unit 902 and to the decoding unit 903, as well as to the array 900'.

According to the present disclosure, as detailed in FIGS. 10A-10B and 11-14, the encoding unit and the decoding unit comprise respective circuit portions (also indicated as ECC machines) configured to be selectively activable based on the specific selected ECC protection level. More in particular, each circuit portion may be configured to manage a respective predetermined payload and parity quantity of the codeword, which may be variable according to the selected ECC protection level. For example, each circuit portion may be configured to manage a specific payload and parity quantity according to the respective ECC protection level of said circuit portion, said quantity varying from a circuit portion to another.

As already observed for the general operating circuit, in the present disclosure, also the term "circuit portions" is used in a general and nonlimiting way and may be embodied in several ways.

The circuit portions may be activable alone or in groups, in some examples. In an embodiment of the present disclosure, the operating circuit is configured to selectively disable circuit portions relating to unselected ECC protection levels.

Based on this general architecture, the present disclosure provides several techniques to optimize the ECC operation in order to decrease power consumption and/or improve access performances.

According to an embodiment of the present disclosure, the encoding unit and the decoding unit each comprise a dedicated circuit portion (e.g., a single circuit portion) for each single selectable ECC protection level to be applied to the stored data. The dedicated circuit portions may be selectively and independently activable and, as above, the operating circuit may be configured to selectively disable circuit portions relating to unselected ECC protection levels.

Figure 10A:
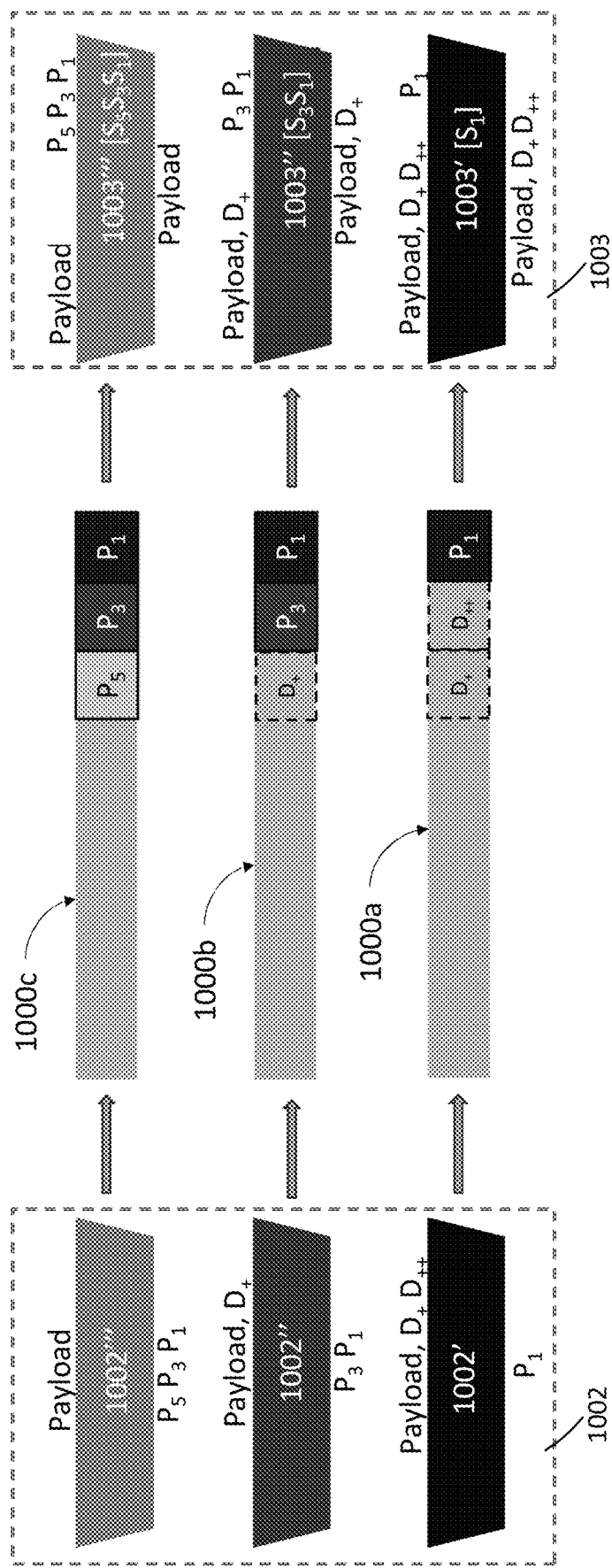
FIGS. 10A and 10B are examples of a selection of ECC protection levels and related circuit portions according to an embodiment to the present disclosure.

In the nonlimiting example of FIG. 10A, a codeword may comprise a payload portion and a parity portion, as also discussed in relation to FIG. 3. As shown in FIG. 10A, when a low ECC protection level is needed (as in codeword 1000a where only parity cells $P_1$ are used for storing parity data), the payload can be larger (e.g. also cells $D_+$ and $D_{++}$ contain extra payload data in unused parity cells) and the codeword is handled by circuit portion 1002' of encoding unit 1002 (which may correspond to encoding unit 902 of FIG. 9) and by corresponding circuit portion 1003' of decoding unit 1003 (which may correspond to decoding unit 903 of FIG. 9). In one example, circuit portion 1003' may be an ECC1 error correction engine.

Based on selection of a given ECC correction capability ECC1, for example, upon receipt of a program command, circuit portion 1002' encodes payload data (including extra payload $D_+$ and $D_{++}$, that otherwise should be written to different codewords) and computes parity bits $P_1$ for storage in codeword 1000a. Upon receipt of a read command, circuit portion 1003' accesses and decodes codeword 1000a, computes syndrome $S_1$ and applies error correction, if necessary/possible, to obtain payload, including extra payload $D_+$ and $D_{++}$, for output.

If the ECC protection level is increased (for example to ECC2, as in codeword 1000b, where parity cells $P_1$ and $P_3$ are used for storing parity data), the stored payload is decreased (e.g. only cells $D_+$ contain extra payload data in unused parity cells) and the codeword is handled by circuit portion 1002" of the encoding unit 1002 and by corresponding circuit portion 1003" of the decoding unit 1003. In one example, circuit portion 1003" may be an ECC2 error correction engine.

If the selected ECC protection level is maximum (as in codeword 1000c where parity cells $P_1$, $P_3$ and $P_5$ are used for storing parity data), all the parity cells are used for storing parity bits and the payload content is minimum (e.g., corresponding to the nominal payload capacity, since there are no more unused parity cell available for storing extra payload). In this latter case, the codeword is handled by circuit portion 1002"' of the encoding unit 1002 and by corresponding circuit portion 1003"' of the decoding unit 1003. In one example, circuit portion 1003"' may be an ECC3 error correction engine; however, a higher maximum correction capability is possible and more (or less) circuit portions than depicted in FIG. 10A may be implemented.

Based on the selected ECC correction capability ECC2 (ECC3, respectively), for example, upon receipt of a program command, circuit portion 1002" (1002"') encodes payload data, including extra payload D+ but not D++ (without any extra payload) and computes parity bits $P_1$ and $P_3$ ($P_1$, $P_3$ and $P_5$) for storage in codeword 1000b (1000c). Upon receipt of a read command, circuit portion 1003" (1003"') accesses and decodes codeword 1000b (1000c), computes syndrome bits $S_3$ and $S_1$ ($S_5$, $S_3$ and $S_1$) and applies error correction, if necessary/possible to obtain payload, including extra payload D+(without any extra payload, respectively) for output. Specific circuit portions 1002', 1002" and 1002"' and/or 1003', 1003" and 1003" may be selectively and independently activable.

Figure 10B:
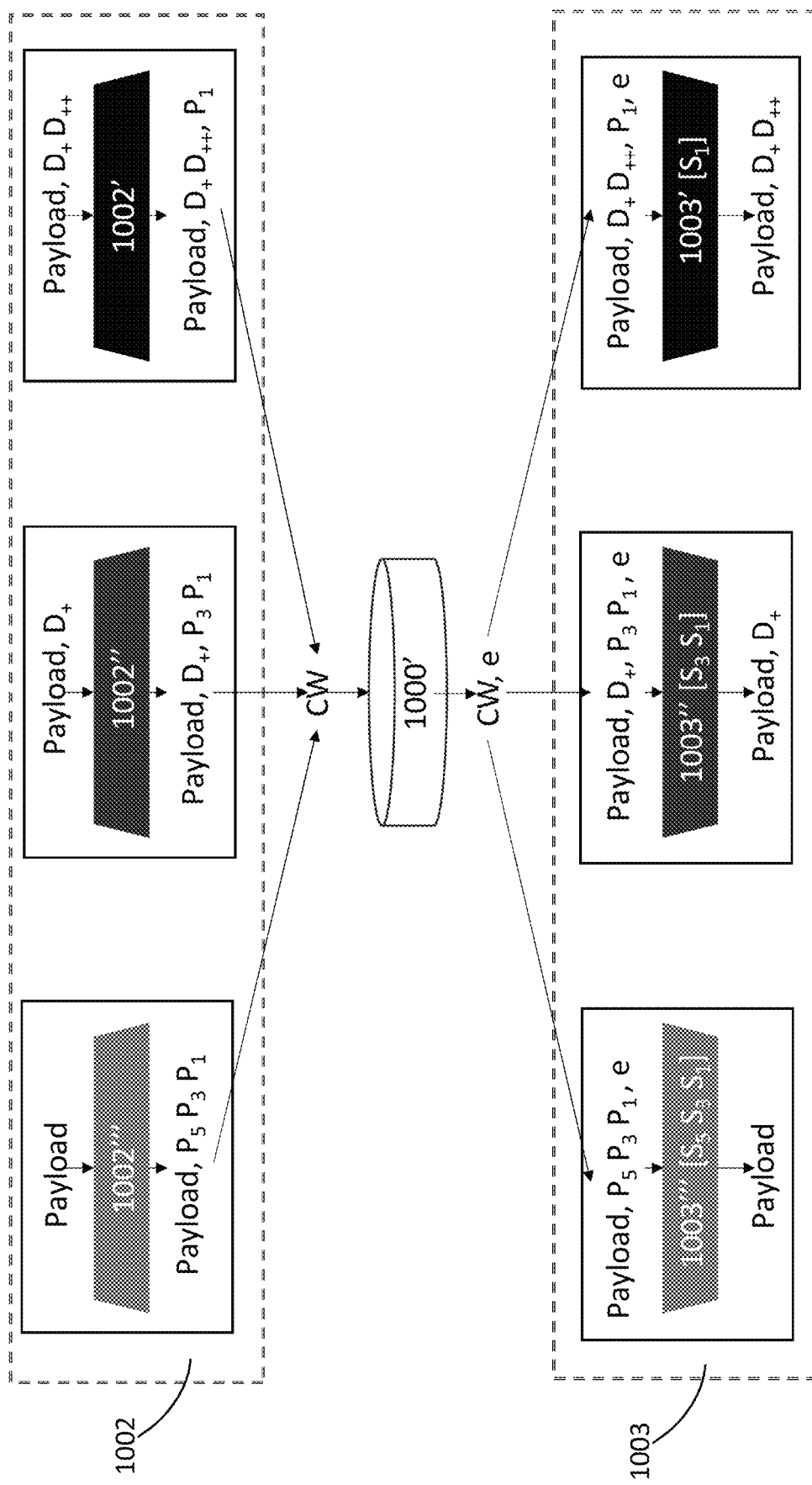

FIG. 10B is a different way for illustrating the embodiment of FIG. 10A, wherein different and separate circuit portions for each different selectable ECC protection level are used in the encoding unit 1002 and in the decoding unit 1003 (e.g., one circuit portion for ECC1, one circuit portion for ECC2, and one circuit portion for ECC3, both at encoding unit 1002 level and decoding unit 1003 level, as in the shown example). Therefore, in this embodiment, ECC hardware specialized for a specific or single ECC protection level is provided, both at encoder and decoder level. Each circuit portion can handle a corresponding quantity of payload bits, which varies according to the implemented ECC protection level.

More specifically, with reference to the example of FIG. 10B, the circuit portion 1002' of the encoding unit 1002 may be designed for a relatively lower ECC protection (for example ECC1); it may be configured to generate a codeword CW comprising payload bits, an extra number of payload bits (indicated as $D_+$ and $D_{++}$) and a number of parity bits (simply denoted as $P_1$, which correspond to bits stored in cells $P_1$ of FIG. 10A). When this codeword CW is stored in array 1000' (which may correspond to array 900' of FIG. 9), an error may occur, this error being denoted as "e" in FIG. 10B. Circuit portion 1003' of the decoding unit 1003 may be selectively activated to receive and process this codeword CW and to apply the specific ECC operation that has been implemented in this specific circuit portion based on the stored parity bits (e.g. ECC1 capable to correct up to 1 error, for example generating syndrome bits $S_1$), so that a corrected data is output from this circuit portion 1003' (including additional information corresponding to $D_+$ and $D_{++}$).

Figure 12:
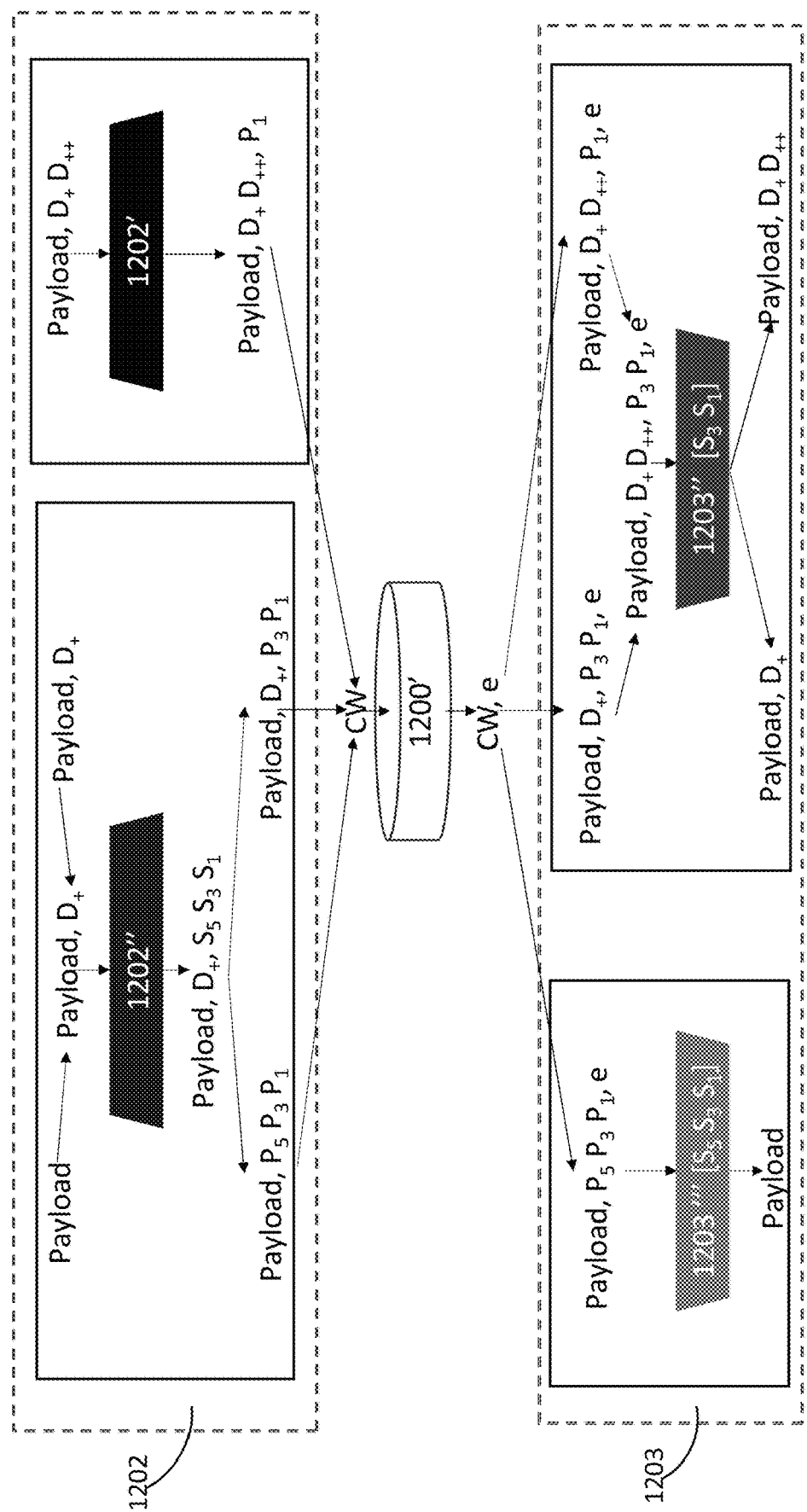
FIG. 12 is an example of a selection of ECC protection levels and related circuit portions according to another embodiment to the present disclosure.

Likewise, circuit portion 1002" of the encoding unit 1002 may be designed for a relatively intermediate ECC protection (for example ECC2); it may be configured to generate a codeword CW comprising payload bits, an extra number of payload bits (indicated as D+) and a number of parity bits (simply denoted as $P_1$ and $P_3$, which correspond to bits stored in cells $P_1$ and $P_3$ of FIG. 10A). When this codeword is stored in the array 1000' (or the array 1200' as illustrated in FIG. 12), an error e may occur. Circuit portion 1003" of the decoding unit 1003 may be selectively activated to receive and process this codeword CW and to apply the ECC operation implemented in this circuit portion 1003" based on the stored parity bits (e.g., ECC2, capable to correct up to 2 errors in this exampleg—enerating syndrome bits $S_1$ and $S_3$), so that a corrected data is output after the ECC operation (including additional information corresponding to D+).

When a relatively higher ECC protection level is required, for example ECC3, circuit portion 1002"' of the encoding unit 1002 may be used; it may be configured to generate a codeword CW comprising payload bits and a number of parity bits (simply denoted as $P_1$, $P_3$ and $P_5$, wherein in this example no extra payload is stored in the codeword). When this codeword is stored in array 1000', an error e may occur. Circuit portion 1003"' of the decoding unit 1003 may be selectively activated to receive and process this codeword CW and to apply the ECC operation implemented in this circuit portion 1003" based on the stored parity bits (e.g., ECC3, capable to correct up to 3 errors in this example—generating syndrome bits $S_1$, $S_3$ and $S_5$), so that a corrected data is output from this circuit portion 1003' after the execution of the ECC operation.

As before, it should be understood that, while three levels of protection are depicted in FIGS. 10A and 10B (e.g., ECC1, ECC2 and ECC3), any number may be conceived. In some examples, circuit portions 1003', 1003" and 1003"' may be an ECC1, ECC2 and ECC3 error correction engine, respectively.

Figure 11:
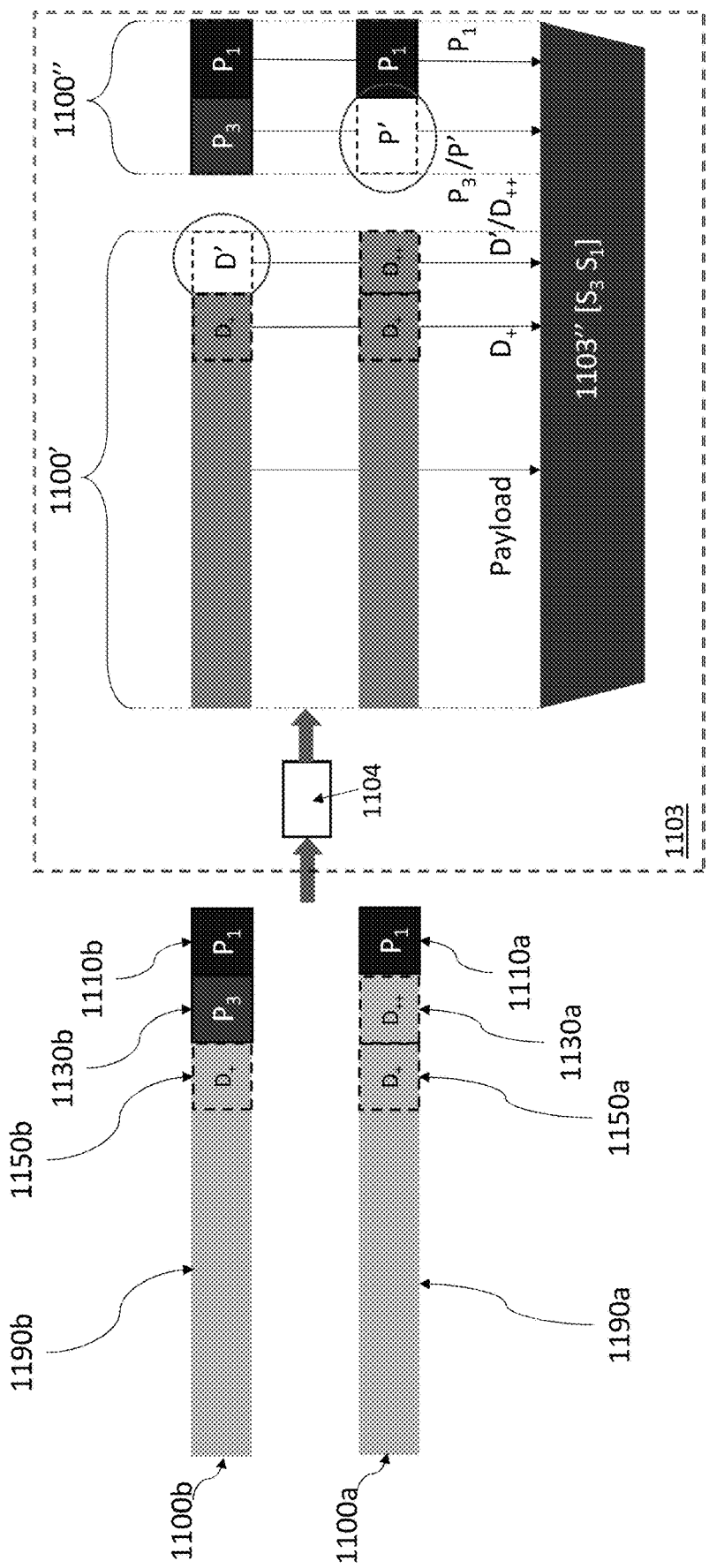
FIG. 11 an example of a selection of ECC protection levels and related circuit portions according to an embodiment to the present disclosure.

Even if in the Figures the circuit portions are illustrated as completely separate from each other (since they perform logically different operations), said circuit portions may also share common portions, for instance in order to reduce the occupied area in the device. For example, in some embodiments, the use of a circuit portion for a higher ECC protection level may involve the activation of at least part of a circuitry related to lower ECC protection levels. In any case, in the embodiment of FIGS. 10A and 10B, specific circuitry relating to specific single ECC protection levels may be disabled when another single ECC protection level is selected. For example, when circuit portion 1002' and/or 1003' are selectively activated, circuit portions 1002"/1003" and 1002"'/1003"' may be disabled. According to another embodiment of the present disclosure, as shown in FIG. 11, the operating circuit may comprise a circuit portion configured to handle more than one ECC protection level. In other words, in this embodiment, at least one of the encoding unit and the decoding unit comprises at least one merged circuit portion configured to manage a plurality of ECC protection levels and to manage a corresponding variable quantity of payload and parity bits, wherein each ECC protection level of the plurality corresponds to a specific payload quantity. In this case, at least part of the ECC circuitry is merged to handle multiple ECC protection levels; when a merged circuit portion is selected and operated, all the related circuitry thereof is activated.

In the nonlimiting example of FIG. 11, the encoding unit (not shown) generates codewords 1100a and 1100b, respectively encoded according to an ECC1 and ECC2 correction capability, and the decoding unit 1103 comprises a merged circuit portion 1103" configured to manage two ECC protection levels, such as ECC1 (as for codeword 1100a) and ECC2 (as for codeword 1100b). Circuit portion 1103" may be an ECC2 error correction engine adapted to also work as an ECC1 error correction engine, as explained below. Clearly, a different type and/or number of ECC protection levels may be used.

In this embodiment, generally, for codewords having a fixed length (such as codewords 1100a and 1100b), the merged circuit portion 1103" is configured to handle at least the biggest quantity of payload allowed by the ECC protection levels implemented therein (e.g., the maximum payload quantity corresponding to the lowest ECC protection level), as well as the biggest quantity of parity data. In other words, the merged circuit portion 1103" is always configured to receive and process a maximum payload quantity, herein referred to as payload portion 1100', as well as a maximum parity quantity, herein referred to as parity portion 1100", the data input to said merged circuit portion 1103" being properly adapted each time as disclosed in the following.

In the example of FIG. 11, when operating in ECC1 selected protection level mode, the merged circuit portion 1103" is adapted to receive and process codeword 1100a (previously encoded and programmed with ECC1 protection level). Circuit portion 1103" is thus configured to receive and process payload portion 1100' comprising nominal payload (stored in cells 1190a), extra bits denoted as $D_+$ (stored in cells 1150a) and extra bits denoted as $D_{++}$ (stored in cells 1130a); payload portion 1100' corresponding to the biggest allowed payload quantity. In this case, the parity information comprises parity bits $P_1$ (to be stored in cells 1110a). Only $P_1$ parity information is necessary when ECC1 protection level is selected, so unused parity cells 1150a and 1130a may be used for storing extra payload D+ and D++, respectively. As it will be understood in the discussion below, circuit portion 1103", that may be an ECC2 engine, expects an input for both $P_1$ and $P_3$ parity bits, so parity bits P' may be appropriately generated by logic unit 1104 (e.g., a first logic unit 1104) based on payload (including extra payload D+ and D++) and $P_1$ parity information, to replace the "missing" ($P_3$) parity bits in consistency with ECC protection capability to feed them in input to circuit portion 1103".

When operating in ECC2 selected protection level mode, the merged circuit portion 1103" is adapted to receive and process codeword 1100b (previously encoded and programmed with ECC2 in this example). In this case, the available codeword payload is smaller (e.g., only nominal payload, stored in cells 1190b, and extra bits $D_+$, stored in cells 1150b of the codeword 1100b-cells 1130b of codeword 1100b accommodate parity bits $P_3$, that add to parity bits $P_1$, stored in cells 1110b of the codeword 1100b to provide for ECC2 protection and, contrary to the example of codeword 1100a, there are no unused cells to accommodate extra bits $D_{++}$).

In any case, the merged circuit portion 1103", that may be an ECC2 engine able to correct up to 2 errors based on $P_3$ and $P_1$ parity information, is configured to receive the maximum allowed payload quantity (e.g., payload comprising extra bits $D_+$ and $D_{++}$ in this example) to operate in ECC1 protection level mode, as described above. Accordingly, in an embodiment, when a higher ECC protection level is used in the merged circuit portion, payload inputs corresponding to data unavailable in the codeword are fed with certain added or replacement bits which are denoted as D' in FIG. 11; the added replacement bits D' are generated in consistency with ECC2 protection capability to feed them in input to circuit portion 1103". Depending on the ECC2 engine implementation, generated bits D' may be bits having a constant value, such as a predetermined constant value, for example; in some cases, the corresponding input to circuit portion 1103" may be coupled to a reference signal line to provide the desired input pattern, when ECC2 protection mode is selected. In other words, when a higher ECC protection level is used in the merged circuit portion 1103", the payload quantity which is missing but which is anyway expected as an input is replaced by adding the bits D' to complete the codeword portion 1100'.

For example, the replacement bits D' may be one or more bits with a logic value of 0, replacing the extra payload (D++) which was used in case of a lower ECC protection level (e.g., ECC1). Bits having different logic values may also be added. Many choices for predetermining the constant values and/or pattern of replacement bits D' are possible and the disclosure is not limited to any of them. The logic value of D' bits may be predetermined consistently with the overall encoding/decoding scheme. In other words, the syndrome bits ($S_1$ and $S_3$) computation is based on the actual payload, including extra payload D+ and predetermined D' values. For example, whichever ECC engine is implemented, at encoding the parity bits ($P_1$ and $P_3$ in section 1100") may be computed on manipulated payload portion 1100' (e.g., based on user, or nominal, payload bits, $D_+$ extra payload bits and predetermined D' bits); however, the predetermined replacement D' bits are not stored (because they are known). At decoding, the stored codeword is accessed and the predetermined bits D' are used to replace missing information before executing the ECC operation, to comply with the number of inputs of the ECC2 engine.

In this embodiment, the merged circuit portion 1103", which is able to process parity bits relating to ECC2 (or more generally, for a higher ECC protection level) for detecting and correcting a corresponding plurality of errors, is also adapted to handle the ECC1 case (or more generally, a lower ECC protection level).

The merged circuit portion 1103" is thus configured to receive and process parity bits relating to all the ECC protection levels it can handle (e.g., in the example of FIG. 11, not only the $P_1$ bits of the parity, but also the $P_3$/P' bits). However, if the codeword is protected with ECC1 (or more generally, with a lower ECC protection level), as codeword 1100a in this example, the expected $P_3$ parity portion (e.g., P' bits) is missing; as a matter of fact it was nor stored nor computed during the encoding phase. Based on the ECC engine implemented, it is possible to generate parity bits P', for $P_3$ input signals replacement, that are consistent with actual parity information $P_1$ retrieved with the access operation. For example, whichever ECC engine is implemented, replacement parity bits P' may be generated, e.g., by logic unit 1104, that are consistent with the error correction encoding and the error correction code engine (e.g., ECC2, in the depicted example), after the stored codeword is accessed. Parity bits P' are added to the stored codeword before executing the ECC operation, to comply with the number of inputs of the ECC2 engine.

The merged circuit portion 1103" of the decoding unit 1103 is configured to receive and/or process manipulated codewords having a maximum number of payload bits (e.g., payload portion 1100' comprising (nominal) payload, and extra payload D+ and D++) corresponding to a lowest (ECC1) and a maximum number of parity bits (e.g. parity portion 1100", comprising parity bits $P_1$ and $P_3$) corresponding to a highest (ECC2) error correction code protection level managed in said at least one merged circuit portion 1103" (e.g., in the ECC2 engine), respectively. In decoding unit 1103, logic unit 1104 may be configured to add extra bits (or replacement bits D') to the payload bits of the codeword (payload and D+) to be input to the merged circuit portion in case the selected ECC protection level (ECC2) is different from the lowest ECC protection level (ECC1). Logic unit 1104 may also be configured to add extra parity bits (P') to the parity bits ($P_1$) to be input to the merged circuit portion 1103" in case the selected ECC protection level (ECC1) is different from the highest ECC protection level (ECC2). Said it differently, in some embodiments, the decoding unit 1103 may be configured to generate replacement parity bits (P' for $P_3$) and/or payload bits (D' for D++) based on the ECC protection level (e.g., when they are not available in the stored codeword) to provide them to circuit portion 1103" (e.g., an ECC2 engine), configured to receive the maximum number of signal (Payload, D+, D'/D++ and $P_3$/P', $P_1$), as described above.

Similar considerations may apply to the encoding unit, as it will be discussed in more detail with reference to FIG. 12.

In other words, in this embodiment, the encoding unit (not shown in FIG. 11) generally comprises a plurality of independently activable circuit portions or at least one merged circuit portion and is configured to manage a plurality of ECC protection levels and to generate codewords having a quantity of payload bits and of parity bits which is variable based on the selected ECC protection level of said plurality of levels. The decoding unit 1103 may comprise at least one merged circuit portion (such as the exemplary merged circuit portion 1103" of FIG. 11) configured to manage a plurality of ECC protection levels and to process codewords, in particular fixed length codewords, having a maximum number of payload bits and of parity bits corresponding at least to the lowest and the highest ECC protection level of the plurality of levels selectable in said merged circuit portion, respectively.

At this regard, the codeword input to the decoding unit is properly manipulated by a logic unit 1104 (e.g., a first logic unit 1104), which may correspond to logic unit 904 of FIG. 9, so that input codeword is properly adapted to each ECC protection level that can be managed by the merged circuit portion 1103". Therefore, the logic unit 1104 (which may be an integral part of the operating circuit as well as a physically separated component connected thereto) is configured to add replacement bits D' to the payload bits of the codeword to be input to the merged circuit portion 1103" in case the selected ECC protection level is not the minimum selectable (e.g., in case of codeword 1100b of FIG. 11), said replacement bits D' having a predetermined logical value, for example.

Moreover, the logic unit 1104 may be configured to add the extra parity bits P' to the parity bits of the codeword to be input to the merged circuit portion 1103" in case the selected ECC level of said merged circuit portion is not the maximum selectable (e.g. in case of codeword 1100a of FIG. 11), these extra parity bits P' being replacement parity bits consistent with the parity bits already stored for the specific selected ECC protection level. In any case, the added parity bits P' contribute to computation of syndrome bits that are consistent with the original parity bits stored for correcting a number of errors corresponding to the selected lower ECC protection level, as needed by the engine for a higher ECC protection level (for example, an ECC2 engine). In some cases, the additional syndrome bits may be directly calculated, consistently with the available parity information. Therefore, due to this input parity data manipulation, the merged circuit portion 1103" (e.g., the ECC2 engine) is able to manage also a lower selected ECC protection level (e.g., ECC1, as in the example of FIG. 11, so that the decoding unit 1103 is able to correct 1 error). In other words, at least one merged circuit portion of the decoding unit is configured to process codewords having a maximum number of payload bits and a maximum number of parity bits corresponding to a lowest and a highest ECC protection level managed in said at least one merged circuit portion, respectively. The embodiment described above may be more area efficient with respect to the solution described with reference to FIG. 10, in some examples.

According to an embodiment of the present disclosure, as shown in FIG. 12, the encoding unit and decoding unit may be optimized following different ways. For example, encoding unit 1202 (which may correspond to encoding unit 902 of FIG. 9) and decoding unit 1203 (which may correspond to decoding unit 903 of FIG. 9) comprise respective merged circuit portions (such as merged circuit portions 1202" and 1203" in FIG. 12). These merged circuit portions may be configured as shown with reference to FIG. 11, i.e., they may be able to handle at least two ECC protection levels. In this embodiment, the one or more merged circuit portions of the encoding unit 1202 are configured to manage a plurality of ECC protection levels which is different than a plurality of ECC protection levels managed by the one or more merged circuit portions of the decoding unit 1203.

In the example of FIG. 12, the encoding unit 1202 comprises a circuit portion 1202', which is configured to manage a single ECC protection level (e.g., ECC1), and merged circuit portion 1202", which is configured to manage two ECC protection levels (e.g., ECC2 and ECC3). In this example, the decoding unit 1203 comprises a circuit portion 1203", which is configured to manage a single ECC protection level (e.g., ECC3 protection level), and the merged circuit portion 1203", which is configured to manage two ECC protection levels (e.g., ECC1 and ECC2).

More specifically, the merged circuit portion 1202" of the decoding unit 1202 is configured to generate, based on the selected ECC correction capability, either of two different codewords having a same length: a first codeword comprising parity bits $P_1$, $P_3$, $P_5$, and a second codeword comprising parity bits $P_1$, $P_3$ and extra payload D+ (stored in unused parity cell). Clearly, it should be understood any number and/or combination of ECC protection level may be conceived and the architecture is not limited to that of the exemplary figures. In the example of FIG. 12, the circuit portion 1202' may be configured as circuit portion 1002' of FIGS. 10A and 10B, and the circuit portion 1203" '" may be configured as circuit portion 1003'" of FIGS. 10A and 10B. Likewise, the merged circuit portion 1203" of FIG. 12 may correspond to merged circuit portion 1103" of FIG. 11, so that the specific operation of these portions will not be detailed, and reference is made to the previous paragraphs. The hardware implementation of merged circuit portion 1202" and/or 1203" may be optimized and be more area efficient than respective solutions with independently addressable specific circuit portions 1002"/1002'" and/or 1003'/1003", in some cases.

Then, only the desired circuit portions of the encoding unit and/or decoding unit are activated based on the required ECC correction capability, in particular based on the required ECC correction capability of a portion of the plurality of portions of the array, as disclosed above. Summing up, according to embodiments of the present disclosure (as shown in FIG. 12), the memory device comprises at least one circuit portion configured to manage a single ECC protection level and at least one merged circuit portion configured to manage a plurality of ECC protection levels, these circuit portions being selectively and independently activable by the operating circuit. The techniques of the present disclosure therefore allow a great flexibility in ECC circuitry design.

Generally, according to the present disclosure, the ECC operation is optimized to reduce power consumption when a lower ECC protection is used. By selectively enabling or activating only the proper encoder/decoder circuit portion, power consumption may be significantly reduced. Unused ECC circuitry may thus be disabled or deactivated. For example, if the lowest ECC protection level (e.g., ECC1) is needed, blocks 1002", 1003", 1002'", 1003'" of FIGS. 10A and 10B, as well as blocks 1202" and 1203'" of FIG. 12 may be disabled.

Moreover, with the purpose of ECC engine optimization to reduce power consumption, according to embodiments of the present disclosure, the encoding and/or decoding unit may be further divided into subblocks, these subblocks having a further degree of ECC specialization. Therefore, according to the present disclosure, the subdivision of the operating unit into a plurality of specialized circuit portions may be performed at all hierarchic levels thereof.

Figure 13:
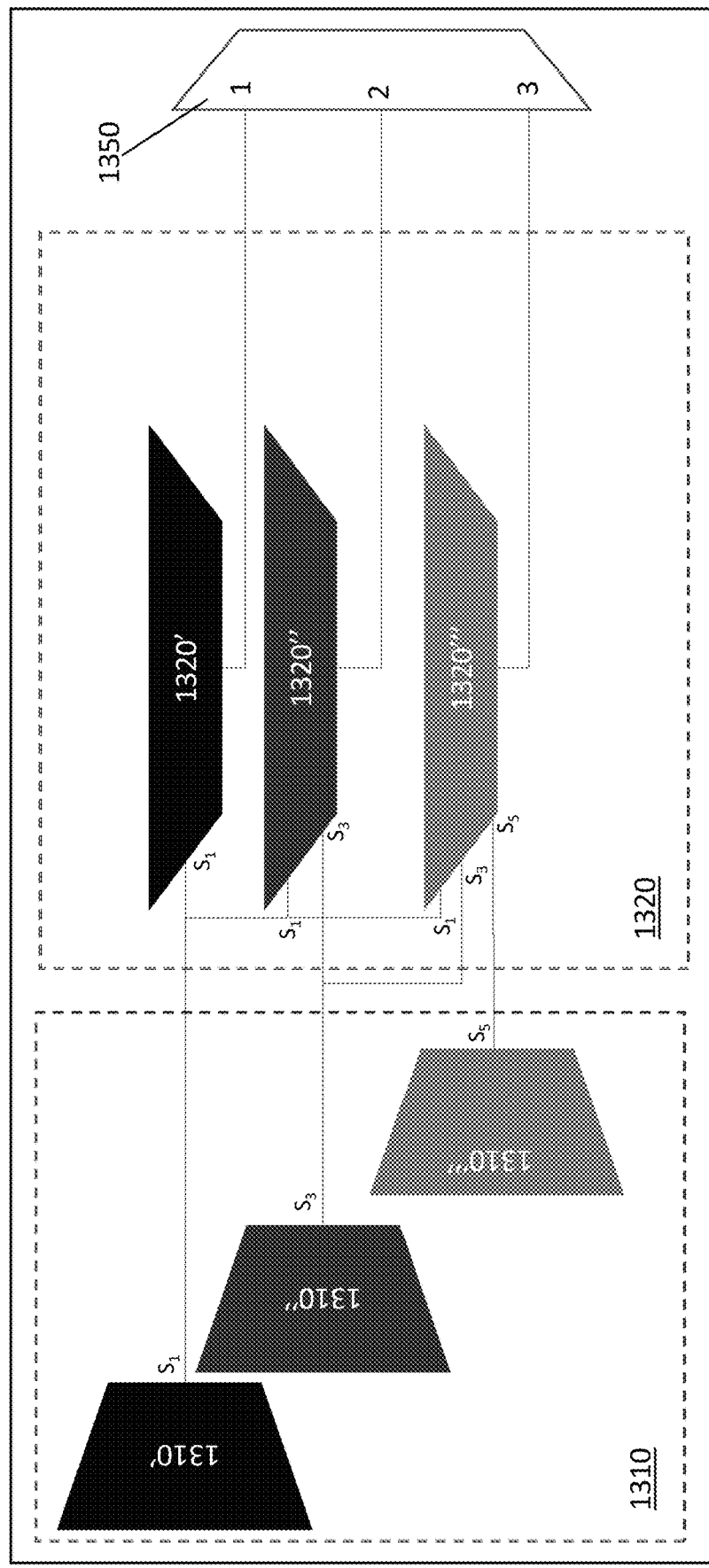
FIG. 13 is an example of a decoder architecture according to an embodiment to the present disclosure.

More in particular, according to an exemplary embodiment shown in FIG. 13, decoding unit 1303 (which may correspond to decoding unit 903 of FIG. 9) comprises a syndrome generating unit 1310 and a syndrome decoding unit 1320. Even more particularly, the syndrome generating unit 1310 comprises sub-circuit portions configured to generate an ECC syndrome based on a selected number of parity bits stored in a codeword (as provided by the encoding unit, for example), and the syndrome decoding unit 1320, that may also be referred to as decoding unit or error correction engine (ECC engine), in turn comprises respective sub-circuit portions configured to perform on the codeword a corresponding ECC operation based on the generated syndrome.

In the example depicted in FIG. 13, syndrome generating sub-circuit portion 1310' is coupled to syndrome decoding sub-circuit portions 1320', 1320" and 1320'" to provide syndrome bits $S_1$. Syndrome generating sub-circuit portion 1310" is coupled to syndrome decoding sub-circuit portions 1320" and 1320'" to provide syndrome bits $S_3$. Syndrome generating sub-circuit portion 1310'" is coupled to syndrome decoding sub-circuit portion 1320'" to provide syndrome bits $S_5$. Each of syndrome decoding sub-circuits 1320', 1320" and 1320'" (e.g., each ECC engine or decoding unit) has its output coupled to a respective input of selector 1350. Selector 1350 is configured to select one of the inputs based on the ECC protection capability. Functioning of syndrome generation 1310 and syndrome decoding 1320 blocks of decoding unit 1303 is explained below, for this particular example.

For example, as shown in the embodiment of FIG. 13, the syndrome generating unit 1310 comprises one sub-circuit portion for each single selectable ECC protection level (i.e., in the syndrome generating unit 1310 there are separated and specialized subblocks). Each subblock may be configured to generate a specialized piece of syndrome for a given ECC protection level. More specifically, each subblock may be configured to generate the syndrome bits that are not generated by a lower ECC protection level subblock. For example, subblock 1310' may be configured to generate syndrome bits S, needed and sufficient for carrying out an ECC1 correction (by circuit portion 1320'). For example, subblock 1310" may be configured to generate syndrome bits $S_3$, needed-in combination with bits $S_1$—for carrying out an ECC2 correction (by circuit portion 1320"). For example, subblock 1310'" may be configured to generate syndrome bits $S_5$, needed-in combination with bits $S_3$ and $S_1$—for carrying out an ECC3 correction (by circuit portion 1320" '"). So each of subblocks 1310', 1310" and 1310" '" may be configured to generate a specialized portion of the syndrome. Indeed ECC2 requires both 1310' and 1310". Subblock 1310' is selectively activable when performing an ECC1 operation (disactivating subblocks 1310" and 1310'"). Sublock 1310' and 1310" may be selectively activated when executing an ECC2 operation (deactivating subblock 1310" "). Subblocks 1310', 1310" and 1310'" may be activated when executing an ECC3 operation.

Likewise, the syndrome decoding unit 1320 comprises one sub-circuit portion for each single selectable ECC protection level (i.e., in the syndrome decoding unit 1320 there are separated and specialized subblocks dedicated to each single selectable ECC correction capability), such as sub-circuit portion 1320' for ECC1 protection level, sub-circuit portion 1320" for ECC2 protection level, and sub-circuit portion 1320" for ECC3 protection level, for example. In this example, in the syndrome generating unit 1310, the sub-circuit portion 1310' generates syndrome $S_1$, which is then used by sub-circuit portion 1320' of the syndrome decoding unit 1320; the sub-circuit portion 1310" generates syndrome $S_3$, which is then used by the sub-circuit portion 1320" together with syndrome $S_1$ to perform the corresponding ECC operation; the sub-circuit portion 1310" generates syndrome $S_5$, which is then used by the sub-circuit portion 1320" together with syndromes $S_1$ and $S_3$ in order to perform an ECC operation with a higher protection levels.

In FIG. 13, the combination of sub-circuit portions 1310' and 1320' may correspond to circuit portion 1003' of FIGS. 10A and 10B, the combination of sub-circuit portions 1310', 1310" and 1320" may correspond to circuit portion 1003" of FIGS. 10A and 10B, and the combination of sub-circuit portions 1310', 1310", 1310''', and 1320'''' may correspond to circuit portion 1003''' of FIGS. 10A and 10B. These sub-circuit portions may be selectively and independently activable based on the selected ECC correction capability. The appropriate output of syndrome generators (1310) and decoders (1320) blocks is selected by selector 1350 based, at least in part, on the selected ECC correction capability, e.g., on the ECC protection level presently in use. For example, if a codeword stored with ECC1 is read, only syndrome generator circuit portion 1310' and syndrome decoder circuit portion 1320' are activated (e.g., circuit portions 1310", 1310" "', 1320" and 1320''' are disabled resulting in considerable for power saving) and the output is selected by selector 1350 for use.

As seen at higher level in relation to the circuit portions of the encoding and decoding units, also the sub-circuit portions of the syndrome generating unit and syndrome decoding unit may share common circuitry, for instance, in order to reduce occupied area in the device. For example, the use of a sub-circuit portion for a higher ECC protection level may involve the activation of part of circuitry related to lower ECC protection levels (e.g., for processing the corresponding syndrome portion), while unnecessary circuitry may be switched off. Therefore, the circuit portions are logically separate, even if may share common circuitry.

With reference to the embodiment of FIG. 13, if the selector element 1350 activates output of sub-circuit portion 1320" (e.g., based on ECC3 being selected), sub-circuit portions 1310', 1310" and 1310''' are enabled to generate syndromes $S_1$, $S_3$ and $S_5$, respectively, while circuit portions 1320' and 1320" may be disabled. In some embodiments, described in more detail below with reference to FIG. 14, parts of one or more of sub-blocks 1320' and/or 1320" may be shared with sub-blocks 1320" and/or 1320''', for example; in these cases, part of circuitry of subblocks 1320' and 1320" may be used to process the codeword, e.g., as if they are part of sub-circuit portion 1320".

With reference to the embodiment of FIG. 13, if the selector element 1350 activates output of sub-circuit portion 1320" (based on ECC2 being selected, for example), sub-circuit portions 1310' and 1310" are enabled to generate syndromes $S_1$, and $S_3$, respectively, while blocks 1310''', 1320' and 1320''' may be disabled (or circuitry of sub-block 1320' may be used, at least in part, if it is shared with sub-block 1320").

Therefore, generally, the activation of a specific sub-circuit portion of the syndrome generating unit may depend on the selected ECC protection level. In some embodiments, a specific sub-circuit portion could be always in an active state (e.g., ECC1 syndrome generation related circuitry). Likewise, the activation of a specific sub-circuit portion of the syndrome decoding unit may depend on the selected ECC protection level. As before, in some embodiments, a specific sub-circuit portion could be always in an active state. In some embodiments, the activation of a sub-circuit portion of the syndrome generating unit may be correlated to the activation of a sub-circuit portion of the syndrome decoding unit. In other embodiments, the activation of a sub-circuit portion of the syndrome generating unit may not be correlated to the activation of a sub-circuit portion of the syndrome decoding unit. Generally, sub-circuit portions of syndrome generating unit may be connected to one or more sub-circuit portions of syndrome decoding unit and being activated depending on the needs and/or circumstances.

In other embodiments (not shown), syndrome generators are fully designed for respective syndrome decoder (e.g., respective ECC engine) and generate all syndrome bits needed. For example, an ECC1 syndrome generator may be configured to generate $S_1$ syndrome bits for the ECC1 engine, an ECC2 syndrome generator may be configured to generate $S_1$ and $S_3$ syndrome bits for the ECC2 engine, and an ECC3 syndrome generator may be configured to generate $S_1$, $S_3$ and $S_5$ syndrome bits for the ECC3 engine. When one ECC syndrome generator and respective ECC syndrome decoder are activated, e.g., based on the selected ECC correction capability, the other syndrome generator(s) and decoder(s) are deactivated, with corresponding power consumption saving.

Figure 14A:
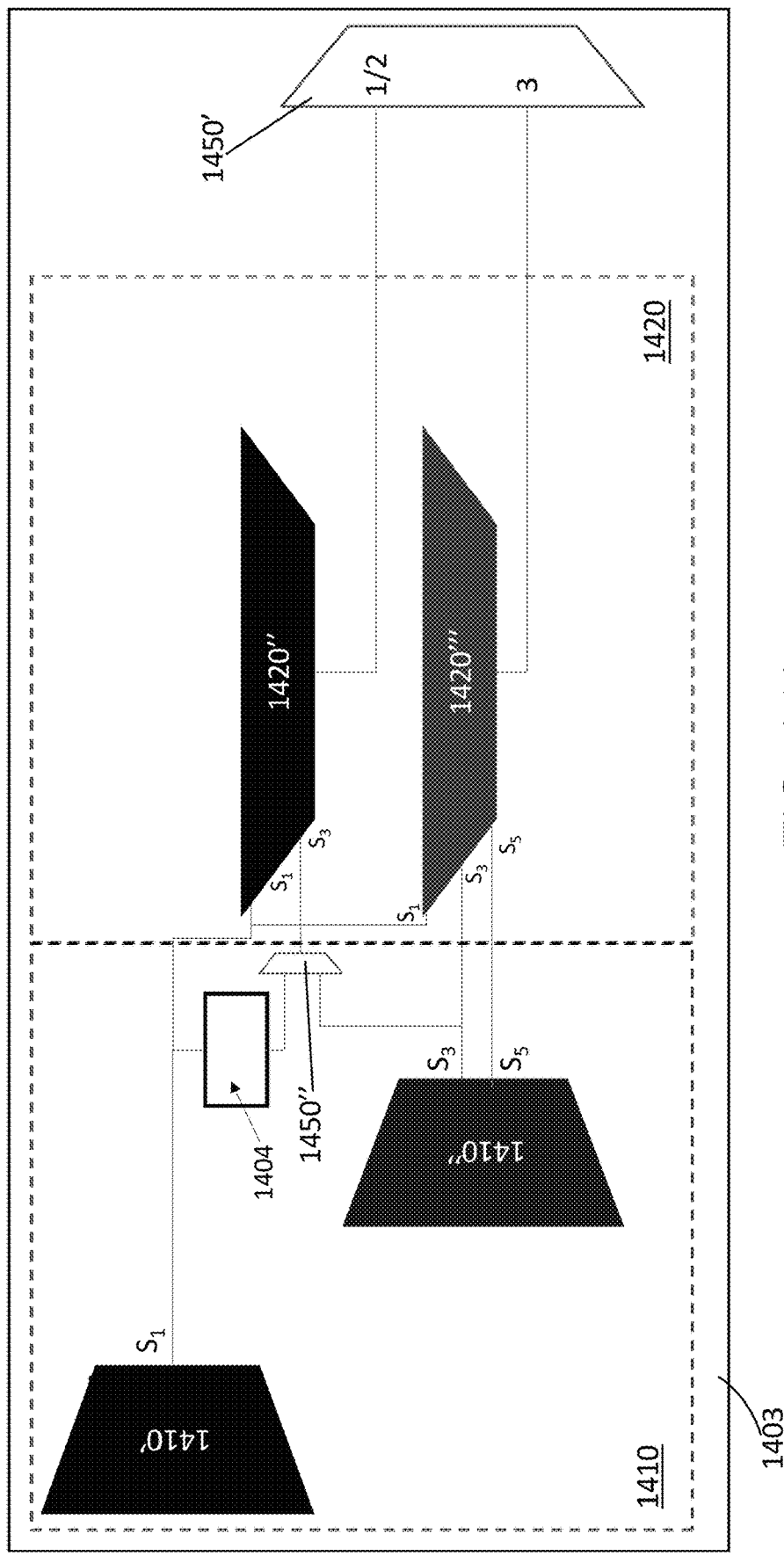
FIG. 14A is an example of a decoder architecture according to another embodiment to the present disclosure.

Generally, according to the present disclosure, the operating circuit comprises at least one selector element, such as selector element 1350 of FIG. 13 or selector elements 1450' and 1450" of FIG. 14A, which is configured to selectively enable output of one or more circuit portions or sub-circuit portions based on the selected ECC protection level. For example, in an embodiment, the selector element may be a multiplexer with proper inputs/outputs. In an embodiment, as shown in FIG. 13, the selector element may be downstream the operative circuit portions and the selection of the desired circuit portions is made only by said final selector element.

Whereas FIG. 13 shows separated syndrome generators and decoders for each single selectable ECC protection level, according to another embodiment of the present disclosure as shown in FIG. 14A, two or more sub-circuit portions may be merged to handle more than one ECC protection level, e.g., ECC correction capability. In other words, in the embodiment of FIG. 14A, syndrome generating unit 1410 comprises at least one merged circuit portion 1410" configured to manage a plurality of ECC protection levels and to generate a corresponding plurality of ECC syndromes. Additionally or alternatively, syndrome decoding unit 1420 may comprise at least one merged circuit portion 1420" configured to manage a plurality of ECC protection levels and to process a corresponding plurality of ECC syndromes.

According to the nonlimiting example of FIG. 14A, the syndrome generating unit 1410 comprises a sub-circuit portion 1410' configured to manage a single ECC protection level (e.g., ECC1 in this example) and the merged sub-circuit portion 1410" configured to handle two ECC protection levels (e.g., ECC2 and ECC3 in this example). Moreover, the syndrome decoding unit 1420 comprises a sub-circuit portion 1420" configured to manage a single ECC protection level (e.g., ECC3 in this example) and the merged sub-circuit portion 1420" configured to handle two ECC protection levels (e.g., ECC1 and ECC2 in this example). Merged sub-circuit portions 1420" may be configured in a similar fashion as merged circuit portions 1103" and 1203" of FIGS. 11 and 12 and sub-circuit portion 1420" may be configured as circuit portion 1203'''.

In the example depicted in FIG. 14A, syndrome generating sub-circuit portion 1410' is coupled to syndrome decoding sub-circuit portion 1420" and to syndrome decoding sub-circuit portion 1420''' to provide syndrome bits $S_1$. Syndrome decoding sub-circuit portion 1420" is coupled to a first input of a first selector 1450'. Syndrome generating sub-circuit portion 1410" is coupled to syndrome decoding sub-circuit portion 1420" to provide syndrome bits $S_3$ and $S_5$. Syndrome decoding sub-circuit portion 1420" is coupled to a second input of the first selector 1450'. Selector 1450' is configured to select one of the inputs based on the ECC protection capability. Logic unit 1404 is coupled between syndrome generating sub-circuit portion 1410' and a first input of a second selector 1450", where extra bits generated by logic unit 1404 (e.g., a second logic unit 1404, to distinguish it from the first logic unit 1104 in FIG. 11) may be received. Syndrome generating sub-circuit portion 1410", is coupled (to provide syndrome bits $S_3$) to a second input of second selector 1450". An output of second selector 1450" (that may be a multiplexer) is coupled to an input of syndrome decoding sub-circuit portion 1420" to provide syndrome bits $S_3$. (selecting them from one of the two inputs of the second selector, based on the ECC protection level selected). Functioning of syndrome generation 1410 and syndrome decoding 1420 blocks or portions of decoding unit 1403 is explained below, for this particular example.

Referring to the example depicted in FIG. 14A, based on ECC1 protection level being selected, sub-circuit portion 1410' may be enabled e.g., activated, while sub-circuit portion 1410" may be disabled, e.g., deactivated, in syndrome generating unit 1410. Additionally, sub-circuit portion 1420" may be enabled while sub-circuit portion 1420"' may be disabled in syndrome decoding unit 1420. Logic unit 1404 may generate the necessary additional bits for input to syndrome decoding block 1420" through selector 1450", together with syndrome bits $S_1$ computed by block 1410'.

Logic unit 1404 (which may correspond to logic units 904 of FIG. 9) may be configured to manipulate input data to build the proper codeword to be input to a merged sub-circuit portion (in the nonlimiting example of FIG. 14A, for the merged sub-circuit portion 1420" of the syndrome decoding unit 1420), so that the expected number of syndrome bits (and possibly payload bits) is fed to said merged circuit portion. For example, the logic unit 1404 may be activated based on the selected ECC correction capability, in particular when a codeword has to be processed by merged sub-circuit portion 1420", such as in case of access (e.g., read) with ECC1 protection capability. Replacement syndrome bits may be computed (e.g., generated) by logic unit 1404 based on syndrome bits of the codeword to be input to the merged circuit portion in case the selected ECC level is different from the highest ECC protection level. Replacement syndrome bits may be input to ECC engine 1420" (through second selector 1450") in place of bits that otherwise could not be calculated (because of lack of parity information in the stored codeword, in which unused parity cells, e.g., in excess of $P_1$ parity bits, may have been used to store extra payload (D++, for example). The complete syndrome information, may be required by the syndrome decoding block or portion 1420", configured to manage either ECC1 or ECC2 protection capability as described above (block 1420" may be an ECC2 engine requiring both $S_1$ and $S_3$ syndrome bits). In general, when an ECC engine is also used at a lower correction capability than the highest ECC protection level, the parity information stored in the codeword may not be sufficient for computing all the syndrome bits required by the ECC engine because the memory cells normally allocated for parity information have been used for additional payload/data storage (e.g., D+ and/or D++). The $S_3$ replacement syndrome bits are computed by logic unit 1404 consistently with the adopted ECC scheme, e.g., allowing ECC1 compliant computation by the ECC2 engine, in this example.

In some embodiments, the second logic unit 1404 may be configured to calculate the cube $S_{13}$ starting from syndrome bits $S_1$, even if many other operations are possible. For example, when the ECC engine is implemented by a BCH code, in case of a selected ECC1 protection level (i.e., one error correction capability), the syndrome bits $S_3$ (i.e., the bits normally needed by the ECC2 engine, that however it is not possible to compute from the stored information) may be replaced by $S_{13}$, i.e., by the cube of the parity bits $S_1$. Therefore, in case of BCH codes, starting from the parity bits $P_1$ (the only available in the stored codeword) syndrome bits $S_1$, are computed, e.g., by block 1410', and logic unit 1404 may compute the cube thereof (i.e., $S_{13}$) as replacement syndrome bits; finally, said replacement syndrome bits are fed through second selector 1450" to the merged circuit portion 1103" (e.g., to the ECC2 engine) in order to be implement an ECC1 operation (e.g., based on sole availability of $P_1$ parity bits). The disclosure is not limited to BCH error correction codes, and for each ECC an appropriate set of replacement syndrome bits may be provided. In standard ECC2 correction capability operation, the $S_1$ bits are computed by syndrome generating unit 1410' (and directly input to circuit portion 1420") while the $S_3$ bits are computed by syndrome generation unit 1410" and transferred to block 1420" through second selector 1450".

Selector 1450", based on ECC1 operation, selects the input from logic unit 1404 and transfers it to circuit 1420" for syndrome decoding. Selector 1450' receives, at its first input, the output of syndrome decoding sub-circuit 1420" and selects it, based on ECC1 operation.

Referring to the example depicted in FIG. 14A, based on ECC2 protection level being selected, sub-circuit portions 1410' and 1410" may be enabled in syndrome generating unit 1410 to generate syndrome bits $S_1$ and $S_3$, respectively. Logic unit 1404 may be disabled and selector 1450" may select syndrome bits $S_3$ received from circuit 1410" and transfer them to syndrome decoding circuit 1420". Sub-circuit portion (e.g., merged circuit portion) 1420" may be enabled and may elaborate received inputs $S_1$ and $S_3$; its output is selected by selector 1450', based on ECC2 operation. Sub-circuit portion 1420" in syndrome decoding unit 1420, on the contrary, may be disabled.

Referring to the example depicted in FIG. 14A, based on ECC3 protection level being selected, sub-circuit portions 1410' and 1410" may be enabled in syndrome generating unit 1410 to generate syndrome bits $S_1$, $S_3$ and $S_5$, respectively. Logic unit 1404 and selector 1450" may be disabled. Sub-circuit portion (e.g., merged circuit portion) 1420" in syndrome decoding unit 1420 may be disabled while sub-circuit portion 1420"" may be enabled and it may elaborate received inputs $S_1$, $S_3$ and $S_5$ to produce an output that may be selected by selector 1450', based on ECC3 operation.

In the example of FIG. 14A, in the syndrome generating unit 1410, circuit portion 1410' handles a sole ECC protection level (e.g., ECC1) while the merged circuit portion 1410" handles a plurality of ECC protection levels (e.g., ECC2 and ECC3). In the syndrome decoding unit 1420, the merged circuit portion 1420" handles a plurality of ECC protection levels (e.g., ECC1 and ECC2) while circuit portion 1420'" handles a sole ECC protection level (e.g., ECC3). When the output of merged circuit portion 1420" is selected by selector 1450' (e.g., based on either ECC1 or ECC2 protection level being selected), the selector 1450" is then used to feed input signals to syndrome decoding circuit 1420" selecting signals based on portion 1410' (e.g., bits generated by logic unit 1404) when ECC1 is needed and based on portion 1410" (e.g., actual S3 bits) when ECC2 is needed. In this case, syndrome decoding circuit 1420''' may be disabled. When the output of circuit portion 1420''' is selected by selector 1450' (e.g., based on either ECC1 or ECC2 protection level being selected), merged circuit portion 1420" may be disabled. In any case, it is to be understood that the illustrated configuration is only one of many possible configurations and the present disclosure is not limited by the exemplary embodiments shown in the drawings. For example, a different combination of ECC protection levels and merged sub-circuit portions may be conceived.

Figure 14B:
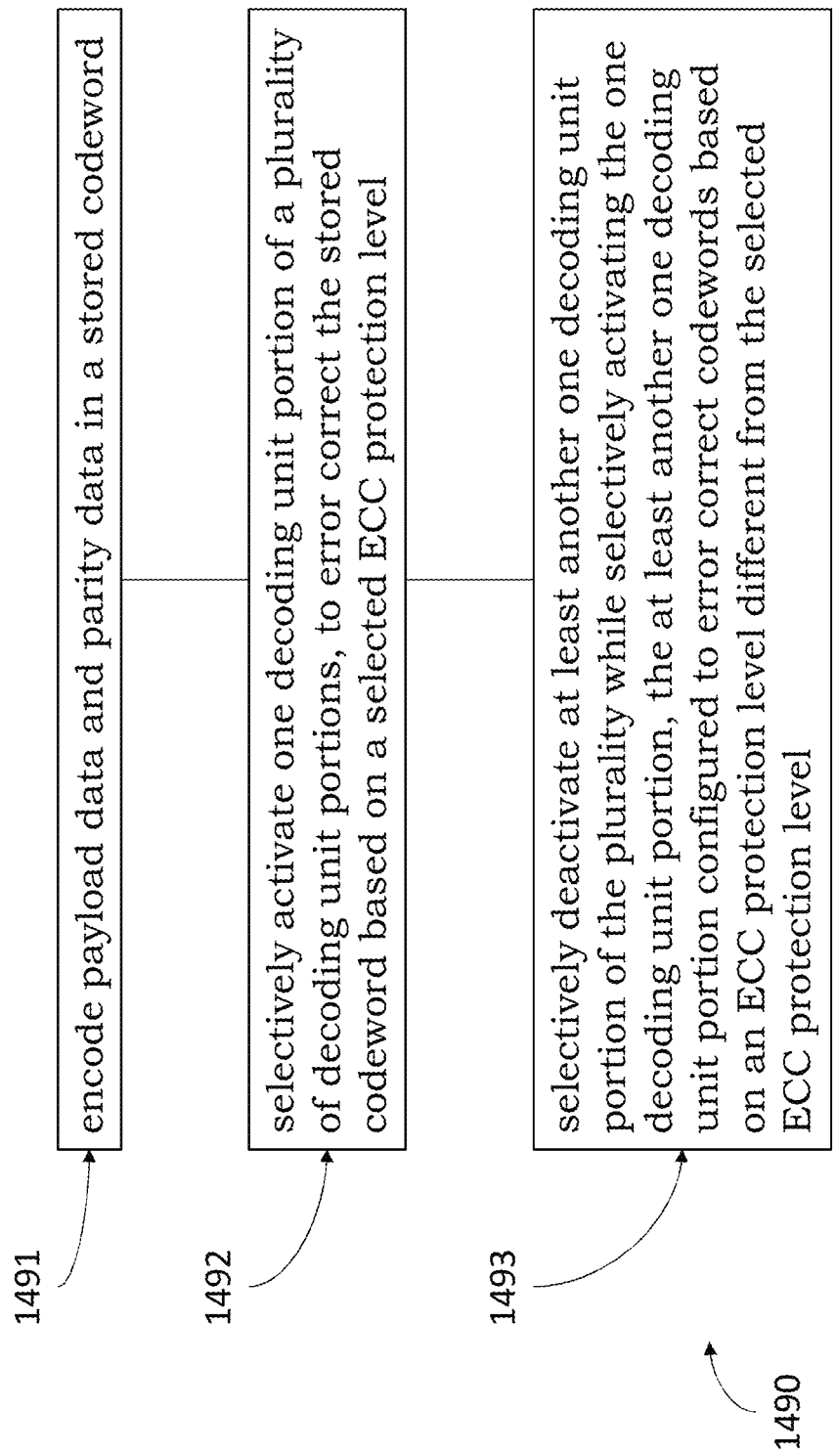
FIG. 14B is a flow diagram of a method to operate a memory device according to embodiments of the present disclosure.

FIG. 14B depicts a flow diagram of a method 1490 to operate a memory device according to embodiments of the present disclosure. According to method 1490 encoding and decoding units and/or their portions, such as those described with reference to FIGS. 1 and 9-14A, may be selectively activated (e.g., enabled) and/or deactivated (e.g., disabled) to operate on payload and parity data/bits, as described, for example, with reference to FIGS. 2, 3, 7, and 10-14A. The encoding/decoding units may be implemented in hardware or software.

Method 1490 may comprise—at step 1491—encoding payload data and parity data in a stored codeword. Encoding may be implemented by units 902, 1002, 1202, or any other mean to encode payload data and parity data in the codeword. The operations of 1491 may be performed according to the methods described herein. In some examples, aspects of the operations of 1491 may be performed by an encoding unit such as 902, 1002, 1202 in FIGS. 9, 10 and 12.

Method 1490 may comprise—at step 1492—selectively activating one decoding unit portion of a plurality of decoding unit portions, to error correct the stored codeword based on a selected ECC protection level. The operations of 1492 may be performed according to the methods described herein. In some examples, aspects of the operations of 1492 may be performed by a portion of a decoding unit such as 903, 1003, 1103, 1203, 1303 and/or 1403 in FIGS. 9-14.

Method 1490 may comprise—at step 1493—selectively deactivating at least another one decoding unit portion of the plurality while selectively activating the one decoding unit portion, the at least another one decoding unit portion configured to error correct codewords based on an ECC protection level different from the selected ECC protection level. The operations of 1493 may be performed according to the methods described herein. In some cases, the activated one decoding unit portion may be an ECCn engine for correcting n errors and the deactivated another one decoding unit portion may be an ECCm engine for correcting m errors, as described above with reference to FIGS. 9-14A, for example.

Method 1490 may comprise (not shown) selectively activating one syndrome generation unit portion of a plurality of syndrome generation unit portions to generate syndrome bits for input to the one decoding unit portion based on the selected ECC protection level. Method 1490 may also comprise selectively deactivating at least another one syndrome generation unit portion of the plurality of syndrome generation unit portions while selectively activating the one syndrome generation unit portion. For example, only one of syndrome generation unit portions 1310', 1310" and 1310''' or 1410', 1410" and 1410"' may be activated, while the others may be deactivated. These operations may be performed according to the methods described herein.

Method 1490 may further comprise (not shown) selectively activating one circuit portion of an encoding unit for encoding the payload data and a first number of bits of parity data in the stored codeword based on the selected ECC protection level. Method 1490 may also comprise selectively deactivating at least another one circuit portion of the encoding unit while selectively activating the one circuit portion, the at least another circuit portion configured for encoding the payload data and a second number of bits of parity data in the stored codeword based on another ECC protection level different from the selected ECC protection level, the second number different from the first number. For example, only one of encoding circuit portions 1002', 1002" and 1002''' or 1202' and 1202" may be activated, while the others may be deactivated. These operations may be performed according to the methods described herein.

Method 1490 may further comprise (not shown), for encoding payload data and parity data in the stored codeword, using a first number of parity cells based on the selected ECC protection level for encoding the parity data and encoding extra payload data in a second number of parity cells not used for encoding the parity data.

Method 1490 and/or parts thereof may be executed at different times that may be initiated based on an access request in some cases. For example, a program command may initiate the encoding of user's payload data into the stored codeword. For example, a read command may initiate the selectively activating one decoding unit portion and selectively deactivating another decoding unit portion. Some steps of method 1490 may be performed in different order than depicted in FIG. 14B. In some cases the selected ECC protection level may be determined based on an input from a user or based on a status (such as a wear-out status) of the memory cells, for example using a counter to count the number of accesses, as described in detail below.

In order to determine the status (i.e., the health) of the cells of the array (or of a portion thereof), and thus to determine when (and how) the ECC protection level should be changed, several techniques or criteria may be implemented. In general, signals based on triggering events may be generated by the operating unit to actuate the operation of the ECC unit.

According to an embodiment, the triggering event may be provided by a counting unit, such as counting unit 106 of the exemplary memory device 100 of FIG. 1. More in particular, as disclosed with reference to the example of FIG. 1, the memory device 100 comprises the first counter 106', which may be configured to account for the lifetime of the memory cells. The first counter 106' is herein also referred to as cycle counter and is configured to count the occurrence of particular events of portions of the array.

In an embodiment, the first counter 106' is configured to count a number of accesses to the memory cells. However, the present disclosure is not limited to counting the accesses to the memory cells, and the first counter 106' may also be configured to count other events, such as a number of refresh events or a number of power-up events or a combination thereof. In any case, in this embodiment, the number of parity cells to be used for defining the proper ECC correction capability (and therefore the proper number of stored parity bits) is selected based on the value of the first counter 106'.

The first counter 106' may be a non-volatile counter accounting for the elapsed lifetime of memory cells, this information being maintained in the memory even after a switch off event thereof.

Therefore, in an embodiment of the present disclosure, the controller of the device may be configured to obtain a counter value and to compare this value with a threshold value. Based on this comparison, the controller may be configured to generate a signal to be sent to the ECC unit, which may thus enable/disable the proper circuit portions.

FIGS. 15A and 15B are flow diagrams 1500a and 1500b for the selection of the ECC protection level based on the value of the first counter 106' (i.e., based on this lifetime counter). As mentioned before, a lifetime event may be an access to the cells of a portion, as well as many other events. More in particular, FIG. 15A represents a case 1500a in which the ECC protection level is increased during the life of the array, while FIG. 15B represents a case 1500b in which the ECC protection level is reduced during the life of the array (e.g., in case of memory technologies showing better performances after some cycles). In other words, ECC protection level can be increased or reduced depending on what is expected for a specific technology (which may be mapped in a dedicated Look-up table stored in the memory array). A mixed solution is also possible, in some cases (not shown).

More particularly, method 1500a may comprise: initializing the counter (step 1510), incrementing the counter at each lifetime event (step 1520), comparing the value of the first counter to a pre-set threshold value (step 1530a), and, when it is not equal to nor greater than this threshold value, continue from step 1520, while, when it is equal to or greater than this threshold value, checking if the protection level is maximum (step 1540a), and, if it is not, increasing the protection level (step 1550a), while, if the protection level is already at its maximum level, stop (step 1560). Increasing the protection level may comprise using more parity bits during encoding and correspondingly reducing the extra payload, as described above; data possibly stored in extra payload may be relocated. Increasing ECC correction capability may also result in enabling a higher number of sub-circuits during an access operation, in some embodiments. For example, if a more powerful ECC is selected, during a read operation, more syndrome decoding circuits and/or a more complex ECC engine circuit may be activated, as described with reference to FIGS. 13 and 14.

Similarly, method 1500b may comprise: initializing the counter (step 1510), incrementing the counter at each lifetime event (step 1520), comparing the value of the first counter to a pre-set threshold value (step 1530b), and, when it is not equal to nor greater than this threshold value, from step 1520, while, when it is equal to or greater than this threshold value, checking if the protection level is minimum (step 1540b), and, if it is not, reducing the protection level (step 1550b), while, if the protection level is already at its minimum level, stop (step 1560). Decreasing the protection level may comprise using less parity bits during encoding and correspondingly incrementing the available extra payload, as described above. Decreasing ECC correction capability may also result in enabling a smaller number of sub-circuits during an access operation, in some embodiments. If a less powerful ECC is selected, during a read operation, less syndrome decoding circuits and/or a less complex ECC engine circuit may be activated, as described with reference to FIGS. 13 and 14, for example.

Said differently, the ECC protection level is changed (e.g., increased or decreased) when a counter representative of the usage or lapsed lifetime meets a threshold value, as shown in FIGS. 15A and 15B. Therefore, in this embodiment, the first counter is apt to indicate the status of the memory cells (more particularly the status of the memory cells of the various portions, so that different counters may be implemented for corresponding different portions). For example, a specific counter is associated to a specific portion to trigger a variation of the specific ECC correction capability applied to the respective portions based on the specific usage of the respective memory cells. This technique to select the ECC protection level is herein referred to also as lifetime-based technique.

According to another embodiment of the present disclosure, the memory device comprises also a second counter, such as for example the second counter 106" of FIG. 1, which is configured to count a number of errors detected by the ECC, so that the EEC protection level decision is based on this error bit frequency counter.

As in the case of the first counter 106' (i.e., the non-volatile counter used for example to count the number of accesses), also the second counter 106" may be a non-volatile counter, in some examples.

More in particular, in this embodiment, the number of parity bits used for defining the proper ECC correction capability is selected based a counted error frequency, which is obtained as the ratio of the first counter 106' and the second counter 106" values.

Figure 16:
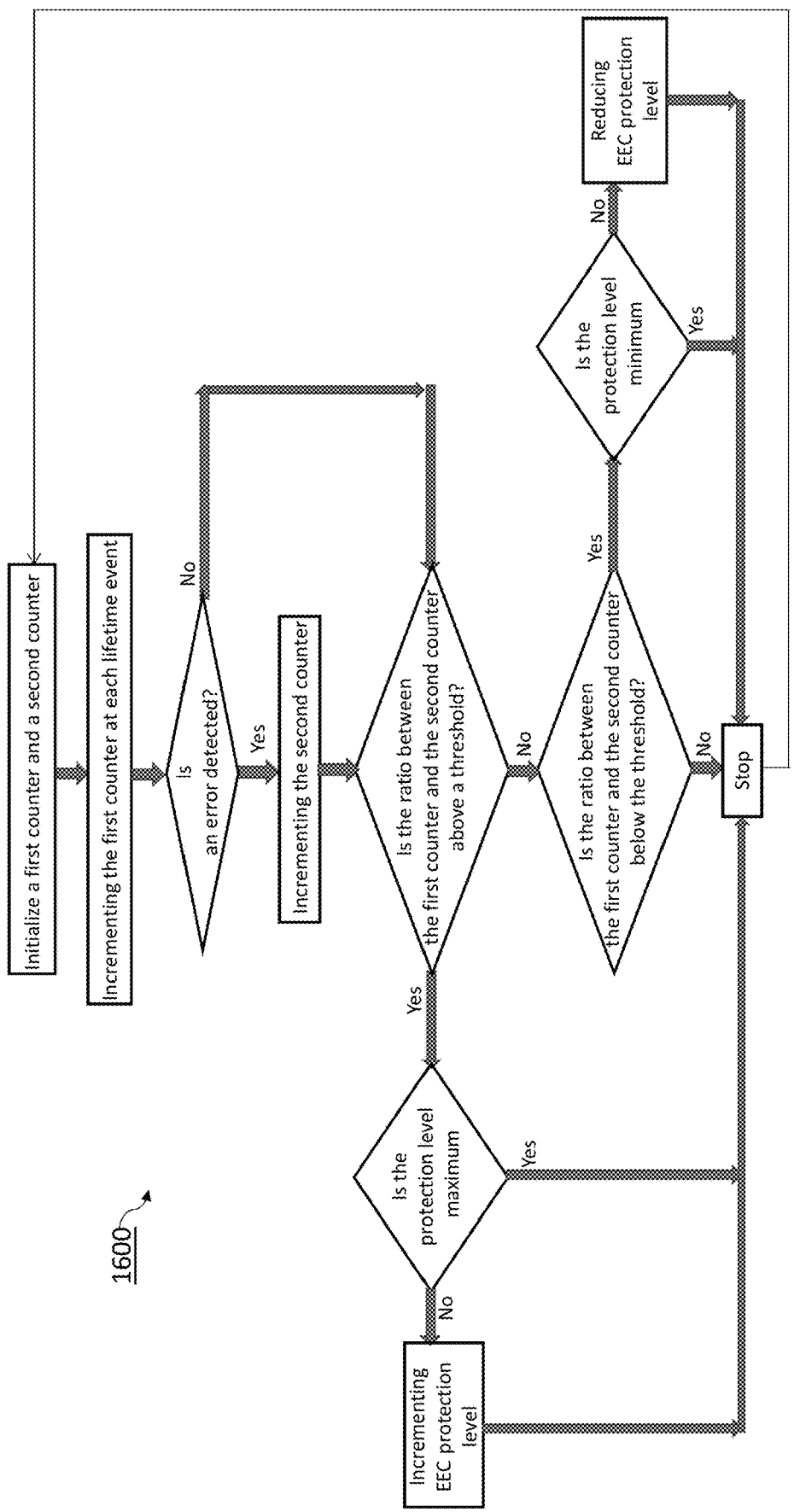
FIG. 16 is a flow diagram representing a technique for selecting the ECC protection level based on a counted error frequency.

FIG. 16 is flow diagram 1600 representing the selection of the ECC protection level based on the counted error frequency.

In particular, the value of the second counter 106" is incremented each time an error is detected by the current implemented ECC. Moreover, each time a lifetime event (e.g. an access) is counted by the first counter 106' (i.e. each time the first counter 106' is incremented), the ratio between the value of the first counter and of the second counter is calculated, yielding the error frequency. This ratio is then compared with a pre-set threshold value.

For example, when the error frequency is greater than the threshold value, the ECC protection level is increased, while when the error frequency is smaller than the threshold value, the ECC protection level is reduced, or vice versa depending on the specific adopted memory technology. Increasing or decreasing the protection level may comprise using more or less parity bits during encoding and correspondingly reducing or increasing the extra payload, as described above; data possibly stored in extra payload may be relocated. Increasing ECC correction capability may also result in enabling or disabling a number of sub-circuits during an access operation, in some embodiments. For example, if a more (less) powerful ECC is selected, during a read operation, more (less) syndrome decoding circuits and/or a more (less) complex ECC engine circuit may be activated, as described with reference to FIGS. 13 and 14

In other words, the number of parity cells used for defining the ECC protection level may be selected based the counted error frequency, which is obtained as the ratio of the content of the first counter and the second counter, the second counter being used to count the number of errors detected by the current ECC. Therefore, in this embodiment, the error frequency indicates the status of the memory cells. This technique to select the ECC protection level is herein referred to also as defectivity-based technique, and it is not limited by the error frequency detection only, and other measurements of defectivity can be used as shown below.

In an embodiment, the counted error frequency may be assigned a different weight depending on the number of errors (e.g., 1, 2 or 3) detected in a same codeword.

As mentioned before, according to the present disclosure, different portions are independently assigned a proper ECC protection level based on their status. Therefore, according to an embodiment, each portion may comprise one or more counter (e.g., the first counter and the second counter) for defining the status thereof. In this way, different counters are associated with different respective portions of the array, each counter being representative of a respective accumulated value (such as number of accesses, number of errors, etc.) for the respective portion, as disclosed above. The ECC protection level variation is thus performed on one or more portions in case the respective accumulated value is equal to or exceeds (or, in other embodiment, is lower than) a threshold value, as seen with reference to FIGS. 15A-15B and 16.

The counter(s) may also be updated by host or by internal sensors in order to count array lifetime time life. For example, in an embodiment, the memory device may comprise means for receiving a user input relating to a user selected ECC protection level.

In any case, the present disclosure is not limited by a specific criterion to determine when the ECC protection level may be changed, and many other techniques are possible.

In some embodiments, a higher protection level may be selected based on an error count during an access operation. For example, detecting one additional error (e.g., with respect to the number of errors previously detected) may trigger an increase of ECC protection level to be applied. In a practical example, if no errors have ever been detected when accessing a codeword, an ECC1 protection level is appropriate (e.g., an ECC correction capability of one error); when an error is detected for the first time, the ECC protection level may be increased to provide ECC2 correction capability (correspondingly activating the additional parity cells as explained above with reference to FIGS. 3-7) in subsequent access operations. Similarly, when a second error is detected, the ECC protection level is further raised, for example to an ECC3 correction capability.

According to an embodiment, the initial status of the memory cells of the array may be defined during sort, e.g., via a testing machine used for evaluating process quality. In this case, the quality of at least one portion of the memory array is firstly tested by means of the testing machine; after the testing operation, the proper number of parity bits to be used for defining the required ECC correction capability is assigned to each portion of the array based on the performed quality test. In other words, testing evaluation may be used to assign a proper starting protection level for each portion.

Figure 17:
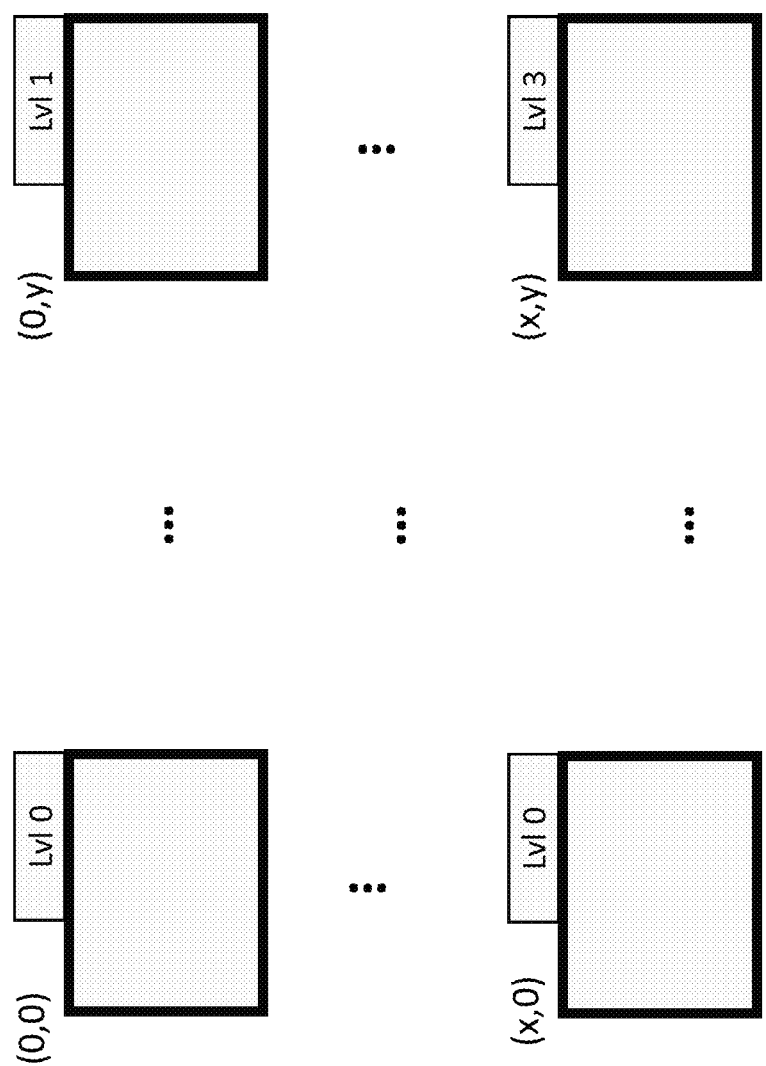
FIG. 17 schematically shows separate portions of a memory array subjected to a testing operation.

FIG. 17 schematically shows separate portions (four of which are depicted) of a memory array subjected to a testing operation. The four separate portions may be independently tested and assigned a different starting ECC protection level after testing. In this way, during testing (sort), reset ECC protection level protection can be allocated depending on the physical characteristics of the die (e.g., silicon quality). For example, portion (0,0) may be assigned a starting ECC protection level Lvl 0 (that may correspond to a minimum ECC correction capability, for example ECC1); portion (0, y) may be assigned a starting ECC protection level Lvl 1 (that may correspond to an intermediate ECC correction capability, for example ECC2); portion (x, 0) may be assigned a starting ECC protection level Lvl 0 (e.g., ECC1); and portion (x, y) may be assigned a starting ECC protection level Lvl 3 (that may correspond to a maximum ECC correction capability, for example ECC4), Other portions (not shown) may be assigned respective starting ECC protection levels. Then, during die life, the ECC correction capability may be assigned and varied for example as shown above with reference to FIGS. 15A-15B and 16.

Alternatively or additionally, according to other embodiments of the present disclosure, the number of parity cells to be used for defining the ECC correction capability is selected by the user.

The ECC protection level may also be selected based on signals of sensors coupled to the memory array, such as sensors included in sensing unit 108. In other words, still referring to FIG. 1, the memory device comprises one or more sensors in the sensing unit 108 which are coupled to the memory section 101 and to the controller 102. The controller 102 may thus be configured to select the number of parity cells to be used for defining the ECC correction capability based on the signals from the sensing unit 108.

Moreover, according to another embodiment, the number of parity cells apt to be used for defining the ECC correction capability is selected based on sense amplifier margin measurement. In other words, the controller may be configured to select the protection level by using sense amplifiers, such as sense amplifiers of circuit portion 105 of FIG. 1.

In this embodiment, the protection level decision based on sensing with multiple reference ensures to precisely establish when the margin is getting too small. This approach can be adopted instead of error frequency detection. In this case, the flow diagram of FIG. 16 is substantially the same but the reset value of the ECC protection level can be no ECC instead of ECC1. In fact, since sense amplifiers can anticipate margin loss, the average ECC protection level can be reduced.

As mentioned before, the memory device can integrate a dedicated hardware, e.g., integrated in the ECC unit 104 of FIG. 1, to properly assign the ECC protection level to each portion of the array and to manage the access to the memory based on the selected ECC correction capability. Modifying the ECC protection level may comprise using more or less parity bits during encoding and correspondingly reducing or increasing the extra payload, as described above; extra payload data may be stored and/or relocated. Modifying ECC correction capability may also result in enabling or disabling a different number of sub-circuits during an access operation, in some embodiments. If a more (less) powerful ECC is selected, during a read operation, more (less) syndrome decoding circuits and/or a more (less) complex ECC engine circuit may be activated, as described with reference to FIGS. 13 and 14, for example.

Summing up, changing the ECC protection level is based on several trigger events, such as internal sensors, conditions, detectors, special markets, process quality, counters, depending on the specific circumstance. For instance, special markets (such as automotive, space, etc.) may require a higher ECC protection.

The ECC unit is therefore programmed to ensure a tradeoff between simplicity and defectivity matching. FIGS. 18A and 18B show schematic exemplary graphs of the cost of the implemented ECC selection algorithm versus aging of the cells of the array. It should be noted that, despite aging is represented on the X-axis, the concepts here disclosed are not limited to cost evolution vs. aging and, rather, they applies to whichever factor that may potentially affect the Bit Error Rate of the memory cells (e.g., lapsing time, cycling, endurance, exposure to high/low temperatures, hard/soft failure mechanisms, voltage drift, etc.; accordingly, aging is only one of many possible examples and the figure should be correspondingly broadly interpreted). As seen for FIGS. 4A and 4B, it is assumed that the defect density (and therefore the required ECC correction power) increases with aging, even if different situations may occur.

More in particular, with reference to FIG. 18A, line 1801' represents an estimated defectivity trend of the cells (based on a linear defectivity increase with aging, or other parameter), while steps 1802' represent the cost trend in terms of occupied area obtained by using a lifetime-based technique for selecting the ECC protection level (e.g. by counting the number of accesses, as generally depicted in FIGS. 15A and 15B). Such an algorithm is thus based an estimated defectivity trend (e.g. the estimated defectivity trend may be obtained by defining a threshold of number of access or generally of lifetime events for switching ECC protection level). On the other hand, line 1803' represents the real defectivity trend of the memory and line 1804' represents the cost of an ECC technique as based on an actual measurement and not only on the estimate thereof (e.g. based on error frequency and/or sense amplifier margin measurements or the like). The operation is thus optimized if the technique used to select the ECC protection level is defectivity-based, which better adapts to the real trend.

With reference to FIG. 18B, lines 1801", 1802", 1803" and 1804" corresponds to lines 1801', 1802', 1803' and 1804' of FIG. 18A, respectively. However, in this case, at graph portion 1805", the real defectivity trend is even worse than expected by the estimated linear scenario, so that a lifetime-based technique would yield a wrong operation of the memory, while a defectivity-based technique is able to follow the real defectivity trend with better average performances in terms of costs.

In other words, the ECC protection level is thus optimized if the algorithm used to program the controller and deciding the proper level is defectivity based and the defectivity trend is better than expected. The average cost in term of area/power/time is in fact reduced, as shown in FIG. 18A. Moreover, the ECC protection level can be too low if the defectivity is worse than expected, as shown in FIG. 18B, so that an adaptive algorithm (e.g. a technique based on error frequency, sense amplifier margin measurements etc.) optimizes the ECC protection level to the actual defectivity and improves reliability. Therefore, a proper protection level algorithm reduces average cost and improves reliability.

Depending on the particular application, a mix of some or even all the disclosed criteria to select the number of parity cells to be used may be chosen. For example, sensing with margin measurement may also be associated with error frequency measurement.

In conclusion, the present disclosure provides a selectable ECC correction capability of a plurality of memory cells by taking into account the evolution of characteristics of the array, instead of forcing the use of the maximum protection (i.e., instead of basing the ECC on end-of-life reliability which always uses the highest ECC protection level and uses all the memory cells dedicated to parity).

According to the present disclosure, the memory is programmed to dynamically adapt the stored payload content in a codeword or other memory section according to the selected (e.g., used) number of parity cells, so that when the ECC correction capability is varied over the lifetime of the memory cells based on the time-varying status thereof, the payload is correspondingly adapted to the varied number of parity cells used for parity information. Memory cells that are not used by parity bits can thus be used to store payload content. The storage of extra payload bits may be partial (for example only half of the unused cells may be used), or all the parity cells may be occupied by extra payload bits. In the context of this disclosure, "extra" or "additional" payload may comprise either or both of payload that would be otherwise be stored in different memory cells (e.g., memory cells at different physical address) or payload in actual excess of nominal storage capacity. In case of payload stored at different memory cells (e.g., in unused parity memory cells), there may be throughput and power-saving advantages, among others, when a relatively lower ECC correction capability is used, as described above. Payload stored in unused parity cells may be relocated on need, e.g., when higher ECC correction capability reclaims parity cells for storing an increased number of parity bits. Similarly, the storage capacity in excess of the nominal one may be available when an ECC correction capability lower than the maximum one is used (e.g., it may be a temporary boost of storage capability).

The ECC correction capability is thus variable over the lifetime of the array based on the time-varying status thereof, so that the ECC protection is adapted to the memory cells health, and the payload is adapted accordingly. According to embodiments of the present disclosure, the ECC protection level is adapted to the protection needs of specific portions of the array, which are independently managed. Portion dimensions may vary from the ECC codeword up to the die. In fact, a portion may correspond to an internal subdivision like a bank group, a bank, a section or whatever other internal subdivision, or may correspond to a specification/host subdivision like a buffer, a page, or may correspond to other beneficial dimensions. In any case, the smaller the portion, the higher the benefits in terms of power consumption.

The ECC protection level is thus increased only when necessary, and the corresponding ECC hardware can be switched off.

The triggering events for switching the ECC protection level may be several and are not limited to a particular technique, which may vary with the memory technology.

According to the present disclosure, based on the selected ECC protection level, it is possible to optimize the ECC circuitry power consumption by adopting specific architectures. For example, a single ECC block or circuit portion per each allowed ECC protection level may be implemented. Alternatively, two or more circuit portions may be merged, obtaining a merged circuit portion configured to handle more than one correction power. A mix of merged and single dedicated circuit may also be possible. The present disclosure ensures a great flexibility in designing system architecture: ECC encoder and ECC decoder may be arranged in a symmetrical manner or may be independently configured. Moreover, ECC Decoder could be split in syndrome generator and syndrome decoder, which may be arranged in a symmetrical manner or may be independently configured.

According to an exemplary embodiment, a memory device comprises an array of memory cells, and an operating circuit for managing the operation of the array, the operating circuit comprising an encoding unit configured to generate a codeword, the codeword comprising payload data stored in a plurality of memory cells of the array, parity data associated with the payload data stored in parity cells of the array, wherein a number of parity cells to be used to store the parity data is selected based on a status of the plurality of memory cells and is related to a corresponding ECC protection level, and extra payload data stored in unused parity cells. The operating circuit further comprises a decoding unit configured to perform an ECC operation on the stored codeword based on the selected ECC protection level, wherein the encoding unit and the decoding unit comprise respective circuit portions configured to be selectively activable based on the selected ECC protection level, and wherein each circuit portion is configured to manage a respective predetermined payload and parity quantity (i.e. a respective number of payload bits and parity bits) of the codeword.

The present disclosure also relates to an exemplary memory device comprising an array of memory cells and an operating circuit for managing the operation of the array, the operating circuit being configured to store payload data in a plurality of memory cells of the array, store parity data associated with the payload data in parity cells of the array, wherein a number of parity cells to be used to store the parity data is selected based on a status of the plurality of memory cells and is related to a corresponding ECC protection level, and store extra payload data in unused parity cells, wherein the encoding unit and the decoding unit comprise respective circuit portions configured to be selectively activable based on the selected ECC protection level, and wherein each circuit portion is configured to manage a respective predetermined payload quantity of the codeword, said payload quantity being variable according to the selected ECC protection level. The operating circuit further comprises at least one selector element configured to selectively enable at least one circuit portion based on the selected ECC protection level and to selectively disable at least part of circuit portions relating to unselected ECC protection levels. In embodiments, the operating circuit may comprise a dedicated specific circuit portion for each single selectable ECC protection level, this specific circuit portion being selectively and independently activable. Alternatively, the operating circuit may comprise at least one merged circuit portion configured to manage a plurality of ECC protection levels and corresponding codewords having a variable quantity of payload and parity bits.

All the features disclosed above may be applied to this exemplary memory device.

A related system, comprising a host device and a memory device as above, is also disclosed, the system comprising for example any of a display communicatively coupled to the memory device or to the host, a network interface communicatively coupled to the memory device or to the host, and a battery coupled to provide power to said system.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A memory device comprising:
    an array of memory cells; and
    an operating circuit for managing operation of the array, the operating circuit comprising:
        a first circuit portion configured to generate a codeword, the codeword comprising:
            payload data stored in a plurality of memory cells of the array;
            extra payload data stored in parity cells of the array not used for storage of parity data; and
            parity data associated with the payload data and the extra payload data, wherein a number of parity cells to be used to store the parity data is selectable based on a status of the plurality of memory cells and related to a corresponding Error Correction Code (ECC) protection level; and
    the operating circuit further comprising:
        a second circuit portion configured to perform an ECC operation on the stored codeword based on a selected ECC protection level,
        wherein the first circuit portion and the second circuit portion are configured to be selectively activated based on the selected ECC protection level, and
        wherein each circuit portion is configured to manage a respective number of payload bits and parity bits of the codeword.

2. The memory device of claim 1, wherein the second circuit portion and the first circuit portion each comprise a plurality of sub-circuit portions each associated to a selectable ECC protection level, said sub-circuit portions being selectively and independently activated.

3. The memory device of claim 2, wherein the operating circuit is configured to selectively disable sub-circuit portions in the plurality that are not associated to the selected ECC protection level.

4. The memory device of claim 1, wherein at least one of the first circuit portion and the second circuit portion comprises at least one merged circuit portion configured to manage a plurality of ECC protection levels.

5. The memory device of claim 4, wherein:
    the at least one merged circuit portion of the first circuit portion is configured to generate codewords having a first number of payload bits and a second number of parity bits, the first number and the second number based on the selected ECC protection level of said plurality of levels; and/or
    the at least one merged circuit portion of the second circuit portion is configured to process codewords having a maximum number of payload bits and a maximum number of parity bits corresponding to a lowest and a highest ECC protection level managed in said at least one merged circuit portion, respectively.

6. The memory device according to claim 5, wherein the operating circuit comprises a first logic unit configured to:
    add replacement bits to the payload bits of the codeword to be input to the merged circuit portion in case the selected ECC protection level is different from the lowest ECC protection level.

7. The memory device according to claim 5, wherein the operating circuit comprises a second logic unit configured to:
    compute replacement syndrome bits based on syndrome bits of the codeword to be input to the merged circuit portion in case the selected ECC level is different from the highest ECC protection level.

8. The memory device according to claim 1, wherein the first circuit portion and the second circuit portion comprise respective merged circuit portions, the merged circuit portions of the first circuit portion being configured to manage a plurality of ECC protection levels which is different from a plurality of ECC protection levels managed by the merged circuit portions of the second circuit portion.

9. The memory device of claim 1, wherein at least one of the first and second circuit portions is configured to manage a single ECC protection level and at least one of the first and second circuit portions is configured to manage a plurality of ECC protection levels.

10. The memory device of claim 1, wherein the second circuit portion is configured to generate an ECC syndrome based on the managed parity bits and to perform a corresponding ECC operation based on the generated syndrome, respectively.

11. The memory device according to claim 10, wherein the second circuit portion includes at least one sub-circuit portion for each selectable ECC protection level, said at least one sub-circuit portions being selectively and independently activated.

12. The memory device according to claim 10, wherein the second circuit portion comprises at least one merged circuit portion configured to manage a plurality of ECC protection levels and to generate or process a corresponding plurality of ECC syndromes.

13. The memory device according to claim 1, wherein the operating circuit comprises a selector element configured to selectively enable one sub-circuit portion of the second circuit portion based on the selected ECC protection level.

14. The memory device of claim 1, wherein the array is divided into a plurality of portions, each portion of the plurality of portions being assigned a specific ECC protection level based on a specific status of the memory cells of said portion.

15. The memory device of claim 1, wherein the array comprises at least one region adapted to store data information relating to the selected ECC correction capability.

16. The memory device of claim 1, comprising a counter configured to count at least one of a number of accesses to the memory cells or a number of refresh events or a number of power-up events or a combination thereof, wherein the status of the plurality of memory cells is based on a value of the counter.

17. The memory device of claim 1, wherein the memory device is configured to receive a user input relating to a user selected ECC protection level.

18. The memory device of claim 1, wherein at least two circuit portions share common circuitry, and/or wherein the operating circuit is configured to activate more than one circuit portion simultaneously.

19. A method to operate a memory device comprising:
encoding payload data and parity data in a stored codeword;
selectively activating one circuit portion of a plurality of circuit portions, to error correct the stored codeword based on a selected ECC protection level; and
selectively deactivating at least another one circuit portion of the plurality while selectively activating the one circuit portion, the at least another one circuit portion configured to error correct codewords based on an ECC protection level different from the selected ECC protection level.

20. The method of claim 19 further comprising:
selectively activating one syndrome generation unit portion of a plurality of syndrome generation unit portions to generate syndrome bits for input to the one circuit portion based on the selected ECC protection level; and
selectively deactivating at least another one syndrome generation unit portion of the plurality of syndrome generation unit portions while selectively activating the one syndrome generation unit portion.

21. The method of claim 19 further comprising:
selectively activating one circuit portion of an encoding unit for encoding the payload data and a first number of bits of parity data in the stored codeword based on the selected ECC protection level; and
selectively deactivating at least another one circuit portion of the encoding unit while selectively activating the one circuit portion, the at least another circuit portion configured for encoding the payload data and a second number of bits of parity data in the stored codeword based on another ECC protection level different from the selected ECC protection level, the second number different from the first number.

22. The method of claim 19 wherein encoding payload data and parity data in the stored codeword comprises:
using a first number of parity cells based on the selected ECC protection level for encoding the parity data; and
encoding extra payload data in a second number of parity cells not used for encoding the parity data.

23. A memory device comprising:
an array of memory cells; and
an operating circuit for managing the operation of the array, the operating circuit being configured to:
store payload data in a plurality of memory cells of the array;
store extra payload data in parity cells not used for storage of parity data; and
store parity data in parity cells of the array, wherein a number of parity cells to be used to store the parity data is selectable based on a status of the plurality of memory cells and related to a corresponding Error Correction Code (ECC) protection level, and wherein the parity data is associated with the payload data and the extra payload data; and
wherein the operating circuit includes a first circuit portion and a second circuit portion configured to be selectively activated based on the selected ECC protection level, and
wherein each circuit portion is configured to manage a respective predetermined payload quantity of the codeword, said payload quantity being variable according to the selected ECC protection level.

24. The memory device of claim 23, wherein the operating circuit comprises a specific circuit portion for each specific selectable ECC protection level, said specific circuit portion being selectively and independently activated, or wherein the operating circuit comprises at least one merged circuit portion configured to manage a plurality of ECC protection levels and corresponding codewords having a variable quantity of payload and parity bits.

25. The memory device of claim 23, further comprising at least one selector element configured to selectively enable a sub-circuit portion of the second circuit portion based on the selected ECC protection level and to selectively disable another sub-circuit portion of the second circuit portion relating to unselected ECC protection level.

26. A system comprising:
a host device; and
a memory device comprising an array of memory cells and an operating circuit for managing the operation of the array, the operating circuit comprising:
  a first circuit portion configured to generate a codeword, the codeword comprising:
    payload data stored in a plurality of memory cells of the array, extra payload data stored in parity cells of the array not used for storage of parity data, and
    parity data associated with the payload data and the extra parity data, wherein a number of parity cells to be used to store the parity data is selectable based on a status of the plurality of memory cells and is related to a selected Error Correction Code (ECC) protection level, and
  a second circuit portion configured to perform an ECC operation on the codeword based on the selected ECC protection level,
wherein the first circuit portion and the second circuit portion are configured to be selectively activated based on the selected ECC protection level, and
wherein each circuit portion is configured to manage a respective number of payload bits and parity bits of the codeword.

* * * * *